(12) United States Patent
Heo et al.

(10) Patent No.: US 12,048,200 B2
(45) Date of Patent: Jul. 23, 2024

(54) DISPLAY APPARATUS

(71) Applicant: LG Display Co., Ltd., Seoul (KR)

(72) Inventors: SeungHo Heo, Paju-si (KR);
SungWook Yoon, Goyang-si (KR);
Chung Hoon Lee, Paju-si (KR);
ByoungHyun Koo, Seoul (KR);
Donghyun Lee, Incheon (KR);
DongMin Jang, Incheon (KR)

(73) Assignee: LG DISPLAY CO., LTD., Seoul (KR)

(*) Notice: Subject to any disclaimer, the term of this patent is extended or adjusted under 35 U.S.C. 154(b) by 172 days.

(21) Appl. No.: 17/398,900

(22) Filed: Aug. 10, 2021

(65) Prior Publication Data

US 2022/0052135 A1 Feb. 17, 2022

(30) Foreign Application Priority Data

Aug. 11, 2020 (KR) .................... 10-2020-0100786

(51) Int. Cl.
*H10K 59/122* (2023.01)
*G09G 3/3233* (2016.01)

(52) U.S. Cl.
CPC ......... *H10K 59/122* (2023.02); *G09G 3/3233* (2013.01); *G09G 2300/0452* (2013.01); *G09G 2320/0214* (2013.01); *G09G 2320/0242* (2013.01)

(58) Field of Classification Search
CPC .................................................. H10K 59/122
USPC ........................................................ 257/40
See application file for complete search history.

(56) References Cited

U.S. PATENT DOCUMENTS

| | | | |
|---|---|---|---|
| 2004/0160170 A1* | 8/2004 | Sato | H10K 50/828 |
| | | | 313/504 |
| 2009/0174320 A1* | 7/2009 | Kim | H10K 50/805 |
| | | | 313/504 |
| 2011/0163331 A1* | 7/2011 | Yamazaki | H10K 50/14 |
| | | | 257/E51.018 |
| 2012/0223342 A1* | 9/2012 | Tanada | H10K 59/86 |
| | | | 257/40 |
| 2018/0166015 A1* | 6/2018 | Beak | H10K 59/1216 |
| 2018/0166518 A1* | 6/2018 | Kim | H10K 59/124 |
| 2018/0301521 A1* | 10/2018 | Yang | H10K 59/35 |
| 2020/0013986 A1* | 1/2020 | Li | G09G 3/3208 |
| 2020/0083489 A1* | 3/2020 | Fang | H10K 71/221 |

* cited by examiner

*Primary Examiner* — Dzung Tran
(74) *Attorney, Agent, or Firm* — Birch, Stewart, Kolasch & Birch, LLP

(57) ABSTRACT

A display apparatus includes a substrate on which a plurality of sub-pixels is defined, a plurality of anodes disposed in each of the plurality of sub-pixels on the substrate, an organic layer disposed on the plurality of anodes, a cathode disposed on the organic layer, and a bank disposed between the anode and the organic layer and between emission areas of each of the plurality of sub-pixels. The bank includes a plurality of trenches, and the organic layer and the cathode are disposed in the bank and the plurality of trenches. As a result, a resistance of the organic layer in which a leakage current flows from the trench increases, so that the leakage current which may be transmitted to the adjacent sub-pixels and color mixing due to the leakage current can be minimized.

22 Claims, 17 Drawing Sheets

DISPLAY APPARATUS

CROSS-REFERENCE TO RELATED APPLICATIONS

This application claims the priority of Korean Patent Application No. 10-2020-0100786 filed on Aug. 11, 2020, in the Korean Intellectual Property Office, the entire contents of which are hereby expressly incorporated herein by reference into the present application.

BACKGROUND

Field

The present disclosure relates to a display apparatus, and more particularly, to a display apparatus capable of improving color mixing of light emitted from a plurality of light emitting devices.

Description of the Related Art

With the recent trend toward the information age, display apparatus fields that visually display electrical information signals have been rapidly developed. In this regard, research to develop various display apparatuses having properties such as slimness, lightweight, and low power consumption has been continued.

Among these display apparatuses, an organic light emitting display apparatus is a self-luminous display apparatus, and does not require a separate light source unlike a liquid crystal display apparatus. Thus, the organic light emitting display apparatus can be manufactured in a lightweight and slim manner.

In addition, the organic light emitting display apparatus is not only advantageous in power consumption by low voltage driving, but also has excellent color implementations, response speed, viewing angle, and contrast ratio CR. As a result, the organic light emitting display apparatus is being studied as the next-generation display.

SUMMARY OF THE DISCLOSURE

An object to be achieved by the present disclosure is to provide a display apparatus capable of minimizing a leakage current while the display apparatus is driven.

Another object to be achieved by the present disclosure is to provide a display apparatus capable of minimizing light emission of some of a plurality of light emitting devices having a common layer due to a leakage current.

Still another object to be achieved by the present disclosure is to provide a display apparatus capable of improving image display quality in low gradation.

Objects of the present disclosure are not limited to the above-mentioned objects, and other objects, which are not mentioned above, can be clearly understood by those skilled in the art from the following descriptions.

According to an aspect of the present disclosure, there is provided a display apparatus. The display apparatus can include a substrate on which a plurality of sub-pixels is defined; a plurality of anodes which is disposed in each of the plurality of sub-pixels on the substrate; an organic layer which is disposed on the plurality of anodes; a cathode which is disposed on the organic layer; and a bank which is disposed between the anode and the organic layer between emission areas of each of the plurality of sub-pixels and includes a plurality of trenches, in which the organic layer and the cathode are disposed in the bank and the plurality of trenches. As a result, a resistance of the organic layer in which a leakage current flows from the trench increases, so that the leakage current transmitted to the adjacent sub-pixels and color mixing due to the leakage current can be minimized.

According to another aspect of the present disclosure, a display apparatus can include a substrate on which a plurality of sub-pixels including red sub-pixels, green sub-pixels, and blue sub-pixels is disposed; a plurality of light emitting devices which is disposed on each of the plurality of sub-pixels and shares a common layer and a cathode; a bank which is disposed under the cathode between each of the plurality of light emitting devices; and a plurality of trenches which is disposed in the bank and spaced apart from each other, in which a resistance of the common layer and the cathode increases as the common layer and the cathode approach the plurality of trenches. As a result, by increasing the resistance of the common layer in the plurality of trenches, it is possible to minimize a display of color abnormalities, spots, or the like due to light emission of some of a plurality of light emitting devices due to a leakage current.

Other detailed matters of the exemplary embodiments are included in the detailed description and the drawings.

According to the present disclosure, it is possible to improve leakage current through the common layer of the light emitting devices.

Further, according to the present disclosure, it is possible to minimize light emitting from unintended light emitting devices due to the leakage current to improve color reproducibility.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
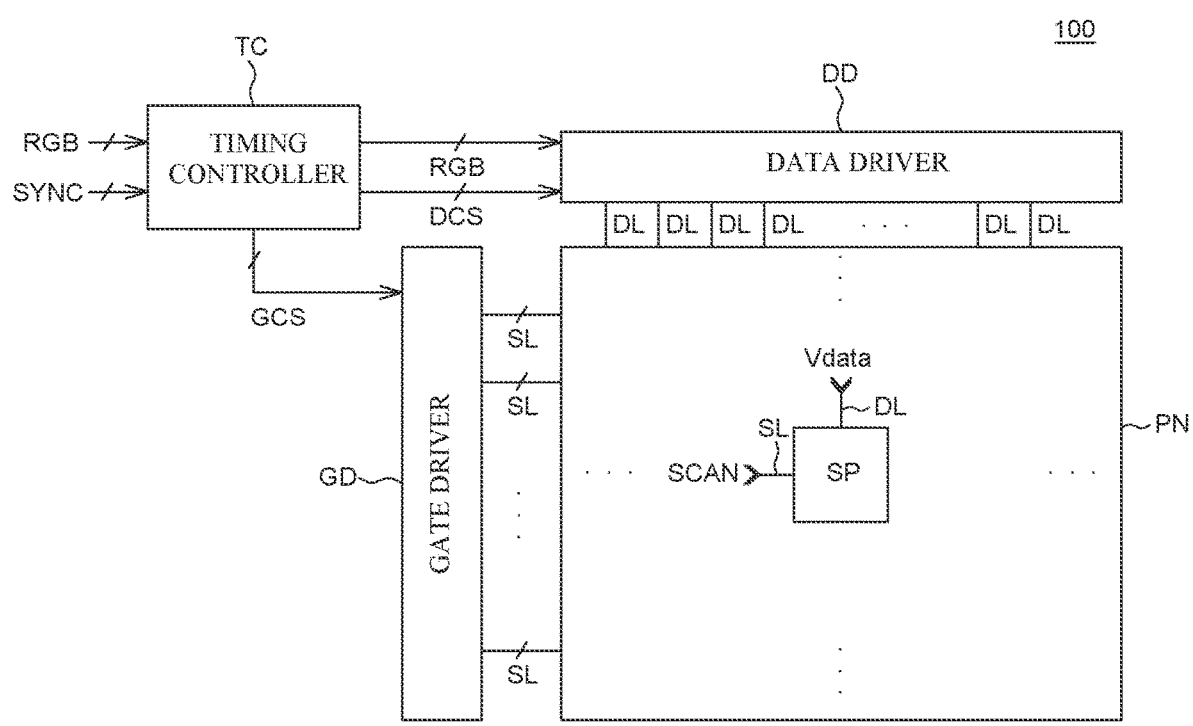
FIG. 1 is a schematic configuration diagram of a display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, it can be directly on the another element or layer, or another layer or another element can be interposed therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display apparatus according to exemplary embodiments of the present disclosure will be described in detail with reference to accompanying drawings. All the components of the display apparatus according to all embodiments of the present disclosure are operatively coupled and configured.

FIG. 1 is a schematic configuration diagram of a display apparatus according to an exemplary embodiment of the present disclosure. Particularly, FIG. 1 illustrates a display panel PN, a gate driver GD, a data driver DD, and a timing controller TC among various components of a display apparatus 100 for convenience of description.

Referring to FIG. 1, the display apparatus 100 includes a display panel PN including a plurality of sub-pixels SP, a gate driver GD and a data driver DD for supplying various signals to the display panel PN, and a timing controller TC for controlling the gate driver GD and the data driver DD.

The gate driver GD supplies a plurality of scan signals SCAN to a plurality of scan lines SL according to a plurality of gate control signals GCS provided from the timing controller TC. FIG. 1 illustrates that one gate driver GD is disposed to be spaced apart from one side of the display panel PN, but the gate driver GD can be disposed in a gate in panel GIP method and the number and disposition of the gate driver GD are not limited thereto.

The data driver DD converts image data RGB input from the timing controller TC into a data signal Vdata using a reference gamma voltage according to a plurality of data control signals DCS provided from the timing controller TC. In addition, the data driver DD can supply the converted data signal Vdata to a plurality of data lines DL.

The timing controller TC aligns the image data RGB input from the outside and supplies the aligned image data RGB to the data driver DD. The timing controller TC can generate a gate control signal GCS and a data control signal DCS using a synchronization signal SYNC input from the outside, for example, a dot clock signal, a data enable signal, and a horizontal/vertical synchronization signal. In addition, the timing controller TC can supply the generated gate control signal GCS and the data control signal DCS to the gate driver GD and the data driver DD, respectively, to control the gate driver GD and the data driver DD.

The display panel PN is a component for displaying an image to a user, and includes a plurality of sub-pixels SP. In the display panel PN, a plurality of scan lines SL and a plurality of data lines DL intersect each other, and each of the plurality of sub-pixels SP is connected to the scan line SL and the data line DL. In addition, each of the plurality of sub-pixels SP can be connected to a high-potential power line, a low-potential power line, an initialization signal line, a light emission control signal line, or the like.

Each of the plurality of sub-pixels SP is a minimum unit constituting a screen, and each of the plurality of sub-pixels SP includes a light emitting device and a pixel circuit for driving the light emitting device, and can be divided into an emission area corresponding to the light emitting device and a non-emission area. The plurality of light emitting devices can be defined differently according to a type of the display panel PN. For example, when the display panel PN is an organic light emitting display panel, the light emitting device can be an organic light emitting device which includes an anode, an organic layer, and a cathode. In addition, a quantum dot light-emitting diode QLED or the like which includes a quantum dot QD can be used as the light emitting device. Hereinafter, a description will be made on the assumption that the light emitting device is an organic light emitting device, but the type of the light emitting device is not limited thereto.

A pixel circuit is a circuit for controlling driving of the light emitting device. The pixel circuit can be configured to include, for example, a plurality of transistors and capacitors, but is not limited thereto.

Hereinafter, the sub-pixel SP of the display apparatus 100 according to the exemplary embodiment of the present disclosure will be described in more detail with reference to FIGS. 2 to 3B.

Figure 2:
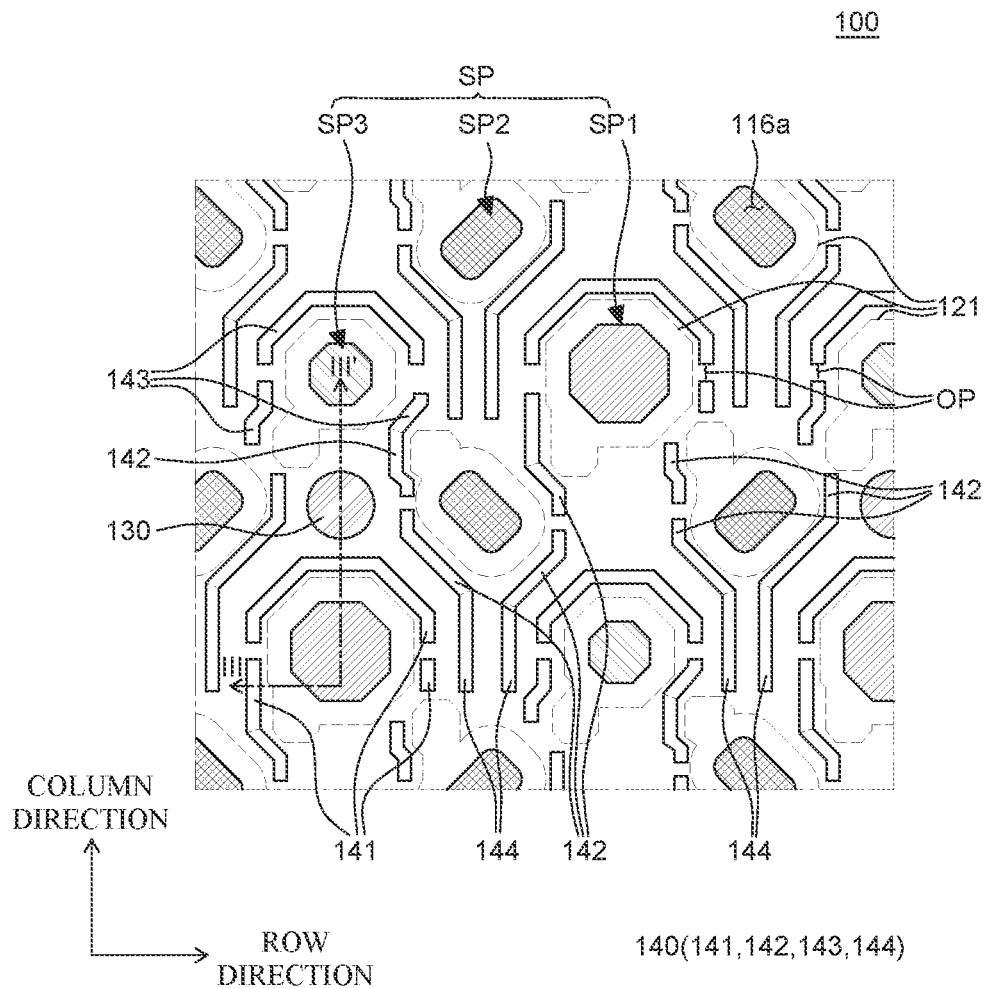
FIG. 2 is an enlarged plan view of the display apparatus according to the exemplary embodiment of the present disclosure.
Figure 3A:
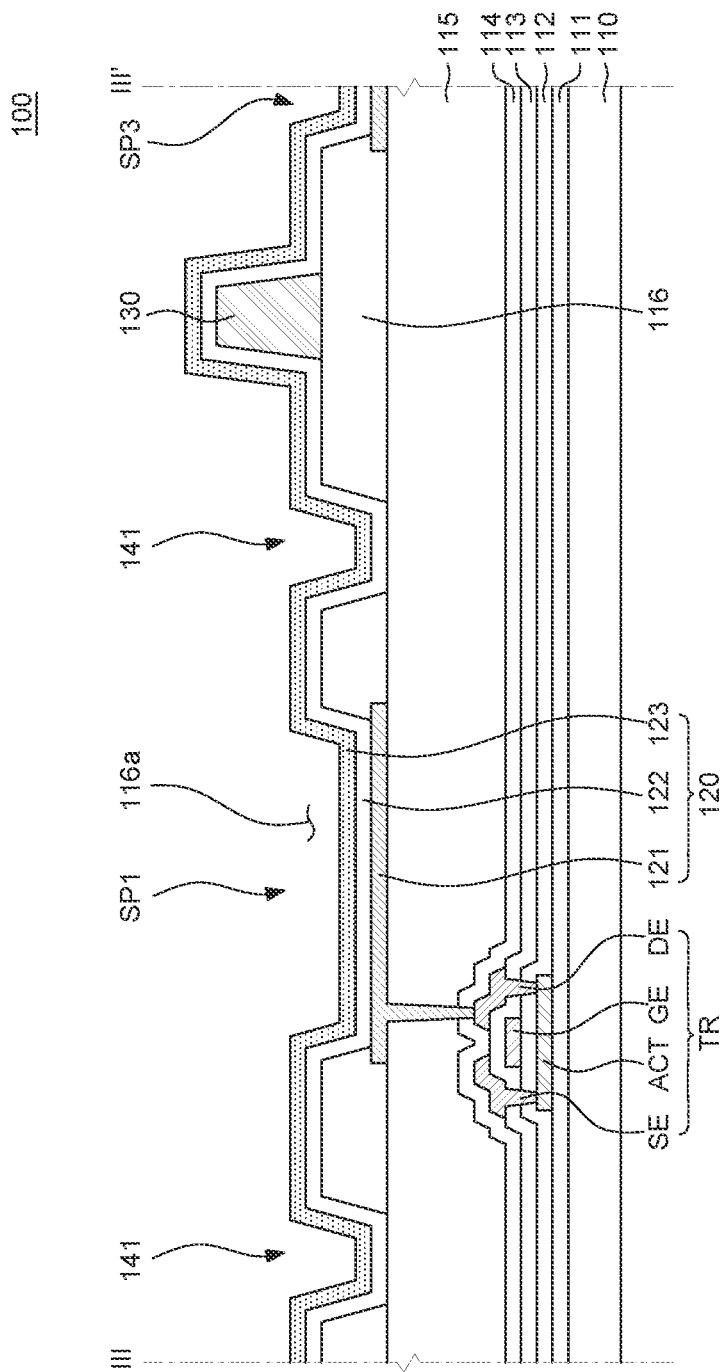
FIGS. 3A and 3B are cross-sectional views taken along line of FIG. 2.

More specifically, FIG. 2 is an enlarged plan view of the display apparatus according to the exemplary embodiment of the present disclosure. FIGS. 3A and 3B are cross-sectional views taken along line III-III' of FIG. 2.

Referring to FIGS. 2 and 3A, the display apparatus 100 according to the exemplary embodiment of the present disclosure includes a substrate 110, a buffer layer 111, a gate insulating layer 112, an interlayer insulating layer 113, a passivation layer 114, a planarization layer 115, a bank 116, a driving transistor TR, a light emitting device 120, a spacer 130, and a plurality of trenches 140. FIG. 2 illustrates only an anode 121 in components of the light emitting device 120.

Referring to FIG. 2, a plurality of sub-pixels SP preferably can be individual units that emit light, and the light emitting device 120 is disposed in the plurality of sub-pixels SP, respectively. The plurality of sub-pixels SP includes a first sub-pixel SP1, a second sub-pixel SP2, and a third sub-pixel SP3 that emit light of different colors. For example, the first sub-pixel SP1 can be a blue sub-pixel, the second sub-pixel SP2 can be a green sub-pixel, and the third sub-pixel SP3 can be a red sub-pixel.

The plurality of first sub-pixels SP1 and the plurality of third sub-pixels SP3 can be alternately disposed in the same column or in the same row. For example, the first sub-pixel SP1 and the third sub-pixel SP3 are alternately disposed in the same column, and the first sub-pixel SP1 and the third sub-pixel SP3 are alternately disposed in the same row.

The plurality of second sub-pixels SP2 is disposed in different columns and rows from the plurality of first sub-pixels SP1 and the plurality of third sub-pixels SP3. For example, the plurality of second sub-pixels SP2 can be disposed in one row, and the plurality of first sub-pixels SP1 and the plurality of third sub-pixels SP3 can be alternately disposed in rows adjacent to one row. The plurality of second sub-pixels SP2 is disposed in one column, and the plurality of first sub-pixels SP1 and the plurality of third sub-pixels SP3 can be alternately disposed in columns adjacent to one column. The plurality of first sub-pixels SP1 and the second sub-pixel SP2 can face each other in a diagonal direction, and the plurality of third sub-pixels SP3 and the second sub-pixel SP2 can also face each other in a diagonal direction. Accordingly, the plurality of sub-pixels SP can be disposed in a lattice shape.

However, FIG. 2 illustrates that the plurality of first sub-pixels SP1 and the plurality of third sub-pixels SP3 are disposed in the same column and row, and the plurality of second sub-pixels SP2 is disposed in different columns and rows from the plurality of first sub-pixels SP1 and the plurality of third sub-pixels SP3, but the disposition of the plurality of sub-pixels SP is not thereto.

In addition, although it has been described herein that the plurality of sub-pixels SP includes the first sub-pixel SP1, the second sub-pixel SP2, and the third sub-pixel SP3, the disposition, number, and color combination of the plurality of sub-pixels SP can be variously changed according to design, but are not limited thereto.

Referring to FIG. 3A, the substrate 110 is a support member for supporting other components of the display apparatus 100 and can be made of an insulating material. For example, the substrate 110 can be made of glass, resin, or the like. Further, the substrate 110 can be made of a polymer or plastic such as polyimide (PI), or can be made of a material having flexibility.

The buffer layer 111 is disposed on the substrate 110. The buffer layer 111 can reduce penetration of moisture or impurities through the substrate 110. The buffer layer 111 can be formed of, for example, a single layer or a multi-layer of silicon oxide (SiOx) or silicon nitride (SiNx), but is not limited thereto. However, the buffer layer 111 can be omitted depending on a type of the substrate 110 or a type of the transistor, but is not limited thereto.

A driving transistor TR is disposed on the buffer layer 111. The driving transistor TR includes an active layer ACT, a gate electrode GE, a source electrode SE, and a drain electrode DE.

The active layer ACT is disposed on the buffer layer 111. The active layer ACT can be made of semiconductor materials such as oxide semiconductor, amorphous silicon, or polysilicon, but is not limited thereto. For example, when the active layer ACT is made of an oxide semiconductor, the active layer ACT includes a channel region, a source region, and a drain region, and the source region and the drain region can be conductive regions, but are limited thereto.

The gate insulating layer 112 is disposed on the active layer ACT. The gate insulating layer 112 is an insulating layer for insulating the active layer ACT and the gate electrode GE, and can be formed of a single layer or a multi-layer of the silicon oxide SiOx or the silicon nitride (SiNx), but is limited thereto.

The gate electrode GE is disposed on the gate insulating layer 112. The gate electrode GE can be made of a conductive material, for example, copper (Cu), aluminum (Al), molybdenum (Mo), nickel (Ni), titanium (Ti), chromium (Cr), or an alloy thereof, but is not limited thereto.

The interlayer insulating layer 113 is disposed on the gate electrode GE. A contact hole for connecting the source electrode SE and the drain electrode DE to the active layer ACT is formed in the interlayer insulating layer 113. The interlayer insulating layer 113 can be formed of, for example, a single layer or a multi-layer of silicon oxide (SiOx) or silicon nitride (SiNx), but is not limited thereto.

The source electrode SE and the drain electrode DE are disposed on the interlayer insulating layer 113. The source electrode SE and the drain electrode DE disposed to be spaced apart from each other can be electrically connected to the active layer ACT. The source electrode SE and the drain electrode DE can be made of a conductive material, for example, copper (Cu), aluminum (Al), molybdenum (Mo), nickel (Ni), titanium (Ti), chromium (Cr), or an alloy thereof, but are not limited thereto.

The passivation layer 114 is disposed on the source electrode SE and the drain electrode DE. The passivation layer 114 is an insulating layer for protecting components under the passivation layer 114. The passivation layer 114 can be formed of, for example, a single layer or a multi-layer of silicon oxide (SiOx) or silicon nitride (SiNx), but is not limited thereto. In addition, the passivation layer 114 can be omitted according to the exemplary embodiment.

Referring to FIGS. 2 and 3A together, the plurality of light emitting devices 120 is disposed in each of the plurality of sub-pixels SP on the planarization layer 115. The light emitting device 120 includes an anode 121, an organic layer 122 and a cathode 123.

The planarization layer 115 is disposed on the passivation layer 114. The planarization layer 115 is an insulating layer that planarizes an upper portion of the substrate 110. The planarization layer 115 can be made of an organic material, and can be formed of a single layer or a multi-layer of, for example, polyimide or photoacryl, but is not limited thereto.

The anode 121 is disposed on the planarization layer 115. The anode 121 can be electrically connected to a transistor of a pixel circuit, for example, the driving transistor TR, and can receive a driving current. The anode 121 supplies holes to the organic layer 122, and thus, can be made of a conductive material having a high work function. The anode 121 can be made of, for example, a transparent conductive material such as indium tin oxide ITO or indium zinc oxide IZO, but is not limited thereto.

Meanwhile, the display apparatus 100 can be implemented by a top emission or bottom emission method. In the case of the top emission method, a reflective layer made of a metal material having excellent reflection efficiency, such as aluminum (Al) or silver (Ag), can be added under the anode 121 so that light emitted from the organic layer 122 is reflected to the anode 121 and is directed upward, for example, toward the cathode 123. On the other hand, when the display apparatus 100 is made by the bottom emission method, the anode 121 can be formed of only a transparent conductive material. Hereinafter, it is assumed that the display apparatus 100 according to the exemplary embodiment of the present disclosure is preferably made using a top emission method.

The bank 116 is disposed on the anode 121 and the planarization layer 115. The bank 116 is an insulating layer disposed between emission areas of the plurality of sub-pixels SP to distinguish the plurality of sub-pixels SP. The bank 116 includes an opening 116a exposing a portion of the anode 121. The bank 116 can be an organic insulating material disposed to cover an edge or a corner portion of the anode 121. The bank 116 can be made of, for example, polyimide, acryl, or benzocyclobutene (BCB)-based resin, but is not limited thereto.

The spacer 130 is disposed between the emission areas the plurality of sub-pixels SP on the bank 116. The spacer 130 can be disposed on the bank 116 to maintain a predetermined distance between a fine metal mask FMM, which is a deposition mask used when forming the light emitting device 120, and the substrate 110. The spacer 130 can maintain the bank 116 and the anode 121 under the spacer 130 from the deposition mask at a predetermined distance, thereby suppressing the bank 116 and the anode 121 from being damaged due to contact between the deposition mask and the bank 116 and the anode 121. In this case, the plurality of spacers 130 can be formed in a form in which a width becomes narrower upward, for example, in a tapered form to minimize an area in contact with the deposition mask.

The organic layer 122 is disposed on the anode 121, the bank 116, the plurality of trenches 140, and the spacer 130.

The organic layer 122 includes the light emitting layer and the common layer. The light emitting layer is the organic layer 122 for emitting light of a specific color, and different light emitting layers can be disposed on the first sub-pixel SP1, the second sub-pixel SP2, and the third sub-pixel SP3, respectively, and the same light emitting layer can be disposed over all of the plurality of sub-pixels SP. For example, when different light emitting layers are disposed in the plurality of sub-pixels SP, respectively, a blue light emitting layer can be disposed in the first sub-pixel SP1, a green light emitting layer can be disposed in the second sub-pixel SP2, and a red light emitting layer can be disposed in the third sub-pixel SP3.

In addition, the light emitting layers of the plurality of sub-pixels SP can be connected to each other to form a single layer over the plurality of sub-pixels SP. For example, the light emitting layer can be disposed over all of the plurality of sub-pixels SP and the light from the light emitting layer can be converted into light having various colors through a separate light conversion layer, a color filter, or the like.

In addition, a plurality of light emitting layers emitting light having the same color can be stacked on one sub-pixel SP. For example, two blue light emitting layers are stacked on the first sub-pixel SP1, two green light emitting layers are stacked on the second sub-pixel SP2, and two red light emitting layers are stacked on the third sub-pixel SP3. In this case, a charge generation layer CGL can be disposed between the plurality of light emitting layers, respectively, so electrons or holes can be smoothly supplied to each of the plurality of light emitting layers. For example, the charge generation layer can be disposed between two blue light emitting layers, two green light emitting layers, and two red light emitting layers.

In addition, a plurality of light emitting layers emitting light having different colors can be stacked on one sub-pixel SP. For example, a blue light emitting layer and a yellow-green light emitting layer are stacked on all of the plurality of sub-pixels SP, so white light can be implemented in all of the plurality of sub-pixels SP. In this case, the charge generation layer can be disposed between the blue light emitting layer and the yellow-green light emitting layer.

The common layer is the organic layer 122 disposed to improve luminous efficiency of the light emitting layer. The common layer can be formed as one layer over all of the plurality of sub-pixels SP. For example, the common layers of the plurality of sub-pixels SP, respectively, are connected to each other and can be integrally formed. The common layer can include the above-described charge generation layer, or hole injection layer, a hole transport layer, an electron transport layer, an electron injection layer, or the like, but is not limited thereto.

The cathode 123 is disposed on the organic layer 122. The cathode 123 supplies electrons to the organic layer 122, and thus, can be made of a conductive material having a low work function. The cathode 123 can be formed as one layer over all of the plurality of sub-pixels SP. For example, the cathodes 123 of the plurality of sub-pixels SP, respectively, can be connected to each other to be formed integrally. The cathode 123 can be made of, for example, a transparent conductive material such as indium tin oxide ITO and indium zinc oxide (IZO), a metal alloy such as MgAg, a ytterbium (Yb) alloy, or the like, and can further include a metal-doped layer, but is not limited thereto. Meanwhile, the cathode 123 can be electrically connected to a low-potential power line to receive a low-potential power signal.

The plurality of trenches 140 is disposed in the bank 116. The plurality of trenches 140 can be grooves formed in the bank 116 between the emission areas of the plurality of sub-pixels SP. However, the plurality of trenches 140 can be formed from the bank 116 to the planarization layer 115 under the bank 116, but is not limited thereto. Further, the cross-sectional shape of the plurality of trenches 140 can be formed in various shapes such as a V-shape in addition to those shown in the drawings, but is not limited thereto.

The plurality of trenches 140 includes a plurality of first trenches 141, a plurality of second trenches 142, a plurality of third trenches 143, and auxiliary trenches 144.

The plurality of first trenches 141 is disposed to surround the plurality of first sub-pixels SP1, respectively. The plurality of first trenches 141 can be disposed to correspond to edges of each of the plurality of first sub-pixels SP1. The plurality of first trenches 141 can be disposed to correspond to edges of the anodes 121 disposed in the plurality of first sub-pixels SP1.

For example, one of the plurality of first trenches 141 can be disposed to correspond to an edge of the first sub-pixel SP1 in an upper portion, an upper left portion, and an upper right portion of the first sub-pixel SP1. One first trench 141 can include a portion extending in a row direction to correspond to the upper portion of the first sub-pixel SP1, and portions extending in a diagonal direction and a column direction to correspond to each of the upper left portion and the upper right portion of the first sub-pixel SP1.

For example, the other of the plurality of first trenches 141 can be disposed to correspond to the edge of the first sub-pixel SP1 in a lower left portion of the first sub-pixel SP1. The other first trench 141 can include a portion extending in a column direction to correspond to the lower left portion of the first sub-pixel SP1.

For example, another of the plurality of first trenches 141 can be disposed to correspond to the edge of the first sub-pixel SP1 in a lower right portion of the first sub-pixel SP1. Another first trench 141 can include a portion extending in a column direction to correspond to the lower right portion of the first sub-pixel SP1.

The plurality of second trenches 142 is disposed to surround each of the plurality of second sub-pixels SP2. The plurality of second trenches 142 can be disposed to correspond to edges of each of the plurality of second sub-pixels SP2. The plurality of second trenches 142 can be disposed along edges of the anodes 121 disposed in the plurality of second sub-pixels SP2.

For example, one of the plurality of second trenches 142 can be disposed along an edge of the second sub-pixel SP2 in an upper left portion of the second sub-pixel SP2. One second trench 142 can include a portion extending in a column direction to correspond to the upper left portion of the second sub-pixel SP2.

For example, the other of the plurality of second trenches 142 can be disposed to correspond to the edge of the second sub-pixel SP2 in a lower left portion and a part of a lower portion of the second sub-pixel SP2. The other second trench 142 can include a portion extending in a diagonal direction to correspond to the lower left portion and a part of the lower portion of the second sub-pixel SP2.

For example, a second trench 142 corresponding to an upper right portion of the second sub-pixel SP2 and a second trench 142 corresponding to a lower right portion and a part of a lower portion thereof can be disposed in some of the plurality of second sub-pixels SP2.

For example, one second trench 142 corresponding to the right portion and a part of the lower portion of the second sub-pixel SP2 can be disposed in some other of the plurality of second sub-pixels SP2.

The plurality of third trenches 143 is disposed to surround each of the plurality of third sub-pixels SP3. The plurality of third trenches 143 can be disposed to correspond to edges of each of the plurality of third sub-pixels SP3. The plurality of third trenches 143 can be disposed along edges of the anodes 121 disposed in the plurality of third sub-pixels SP3.

For example, one of the plurality of third trenches 143 can be disposed along an edge of the third sub-pixel SP3 in an upper portion, an upper left portion, and an upper right portion of the third sub-pixel SP3. One third trench 143 can include a portion extending in a row direction to correspond to the upper portion of the third sub-pixel SP3, and portions extending in a diagonal direction and a column direction to correspond to each of the upper left portion and the upper right portion of the third sub-pixel SP3.

For example, the other of the plurality of third trenches 143 can be disposed to correspond to the edge of the third sub-pixel SP3 in a lower left portion of the third sub-pixel SP3. The other third trench 143 can include a portion extending in a column direction and a portion extending in a diagonal direction to correspond to the lower left portion of the third sub-pixel SP3.

For example, another of the plurality of third trenches 143 can be disposed to correspond to the edge of the third sub-pixel SP3 in a lower right portion of the third sub-pixel SP3. Another third trench 143 can include a portion extending in a diagonal direction to correspond to the lower right portion of the third sub-pixel SP3.

In this case, at least some of the plurality of first trenches 141, the plurality of second trenches 142, and the plurality of third trenches 143 surrounding each of the plurality of sub-pixels SP can be connected to each other. For example, the first trench 141 disposed in the lower left portion of the first sub-pixel SP1 can be integrally formed with the second trench 142 surrounding the second sub-pixel SP2 disposed in the lower left portion of the first sub-pixel SP1. For example, the third trench 143 disposed in the lower right portion of the third sub-pixel SP3 can be integrally formed with the second trench 142 surrounding the second sub-pixel SP2 disposed in the lower right portion of the third sub-pixel SP3. However, the disposition and connection relationships of the plurality of first trenches 141, the plurality of second trenches 142, and the plurality of third trenches 143 can be variously designed, but are not limited thereto.

A plurality of auxiliary trenches 144 is disposed between the emission areas of the plurality of sub-pixels SP. The plurality of auxiliary trenches 144 can be disposed in any one location between the plurality of first trenches 141, the plurality of second trenches 142, and the plurality of third trenches 143. The plurality of auxiliary trenches 144 can be integrally formed with any one of the plurality of first trenches 141, the plurality of second trenches 142, and the plurality of third trenches 143.

For example, one auxiliary trench 144 can extend from an end portion of the second trench 142 corresponding to a left portion and the lower portion of the second sub-pixel SP2 toward a lower side of the second sub-pixel SP2. The auxiliary trench 144 extending from the end portion of the second trench 142 toward the lower side of the second sub-pixel SP2 can be disposed between the first sub-pixel SP1 and the third sub-pixel SP3 disposed adjacent in the same row. For example, one auxiliary trench 144 can be disposed between the first trench 141 and the third trench 143 adjacent to each other.

For example, other auxiliary trenches 144 can extend from the end portion of the second trench 142 corresponding to the right portion and the lower portion of the second sub-pixel SP2 toward the lower side of the second sub-pixel SP2, and can be disposed between the first sub-pixel SP1 and the third sub-pixel SP3 disposed adjacent to each other in the same row. Other auxiliary trenches 144 can be disposed between the first trench 141 and the third trench 143 adjacent to each other. Accordingly, two auxiliary trenches 144 together with the first trench 141 and the third trench 143 can be disposed between the first sub-pixel SP1 and the third sub-pixel SP3 adjacent to each other. Accordingly, the largest number of trenches 140 can be disposed between the first sub-pixel SP1 and the third sub-pixel SP3.

Meanwhile, a plurality of open areas OP which is opened to be spaced apart from each other is disposed in the plurality of trenches 140, respectively. The plurality of open areas OP are areas between the plurality of first trenches 141, the plurality of second trenches 142, and the plurality of third trenches 143, and are areas in which only the bank 116 is disposed instead of the plurality of trenches 140. In this case, sizes or areas of the plurality of open areas OP can be different from each other. The plurality of open areas OP can lower the resistance of the cathode 123 so that a uniform voltage can be applied to the entire cathode 123 disposed on a front surface of the substrate 110. Specifically, the resistance of the cathode 123 can increase as the cathode 123 approaches the plurality of trenches 140. The cathode 123 is disposed along the plurality of trenches 140, so a length of the cathode 123 can increase and can be difficult to be formed at a uniform thickness within the plurality of trenches 140. Therefore, the resistance of the cathode 123 can increase by the plurality of trenches 140. When the resistance of the cathode 123 increases, it can be difficult to apply a uniform voltage to the entire cathode 123. Accordingly, by forming the plurality of open areas OP in which only the bank 116 is disposed, it is possible to lower the resistance of the cathode 123 and easily transmit a voltage to the entire cathode 123.

For example, the open area OP can be disposed between each of the three first trenches 141 surrounding one first sub-pixel SP1. The open area OP can be disposed in a left portion, a right portion, and a lower portion of one first sub-pixel SP1, respectively. In this case, the size of the open area OP corresponding to the lower portion of the first sub-pixel SP1 can be larger than those of the open areas OP corresponding to the left and right portions of the first sub-pixel SP1.

For example, the open area OP can be disposed between each of the four second trenches 142 surrounding one second sub-pixel SP2 having the first sub-pixel SP1 disposed in the upper right portion thereof. The open area OP can be disposed in an upper portion, a lower portion, a left portion, and a right portion of one second sub-pixel SP2, respectively. In this case, among the plurality of open areas OP, the size of the open area OP corresponding to the upper portion of the second sub-pixel SP2 can be the largest and the size of the open area OP corresponding to the left and right portions of the second sub-pixel SP2 can be the smallest.

For example, the open area OP can be disposed between each of the three second trenches 142 surrounding another second sub-pixel SP2 having the third sub-pixel SP3 disposed in the upper right portion thereof. The open area OP can be disposed in an upper portion, a lower portion, and a left portion of another second sub-pixel SP2, respectively. In this case, among the plurality of open areas OP, the size of the open area OP corresponding to the upper portion of the second sub-pixel SP2 can be the largest and the size of the open area OP corresponding to the left portion of the second sub-pixel SP2 can be the smallest.

For example, the open area OP can be disposed between each of the three third trenches 143 surrounding one third sub-pixel SP3. The open area OP can be disposed in a left portion, a right portion, and a lower portion of one third sub-pixel SP3, respectively. In this case, the size of the open area OP corresponding to the lower portion of the third sub-pixel SP3 can be larger than those of the open areas OP corresponding to the left and right portions of the third sub-pixel SP3.

Meanwhile, among the plurality of open areas OP, the open areas OP corresponding to the left and right portions of the first sub-pixel SP1 can face the auxiliary trench 144. In addition, the open areas OP corresponding to each of the left and right portions of the third sub-pixel SP3 among the plurality of open areas OP can face the auxiliary trench 144.

A depth of each of the plurality of trenches 140 can be the same as the thickness of the bank 116 or can be greater than the thickness of the bank 116. For example, referring to FIG. 3A, when the depth of each of the plurality of trenches 140 is the same as the thickness of the bank 116, a top surface of the planarization layer 115 under the bank 116 can be exposed in the plurality of trenches 140. In this case, the plurality of trenches 140 can be disposed to correspond to each of the plurality of anodes 121 and can be disposed to non-overlap the anode 121. When the plurality of trenches 140 overlaps the plurality of anodes 121, the plurality of anodes 121 covered with the bank 116 can be partially exposed from the bank 116. In this case, the anode 121 exposed from the bank 116 can partially contact the light emitting layer and/or the cathode 123 formed on the front surface of the substrate 110, and thus, light can be emitted from a location other than the emission areas of the plurality of sub-pixels SP. Accordingly, the plurality of trenches 140 can be formed along the edges of each of the plurality of anodes 121 to emit light only from the emission area of each of the plurality of sub-pixels SP, and can be formed not to overlap the plurality of anodes 121.

Figure 3B:
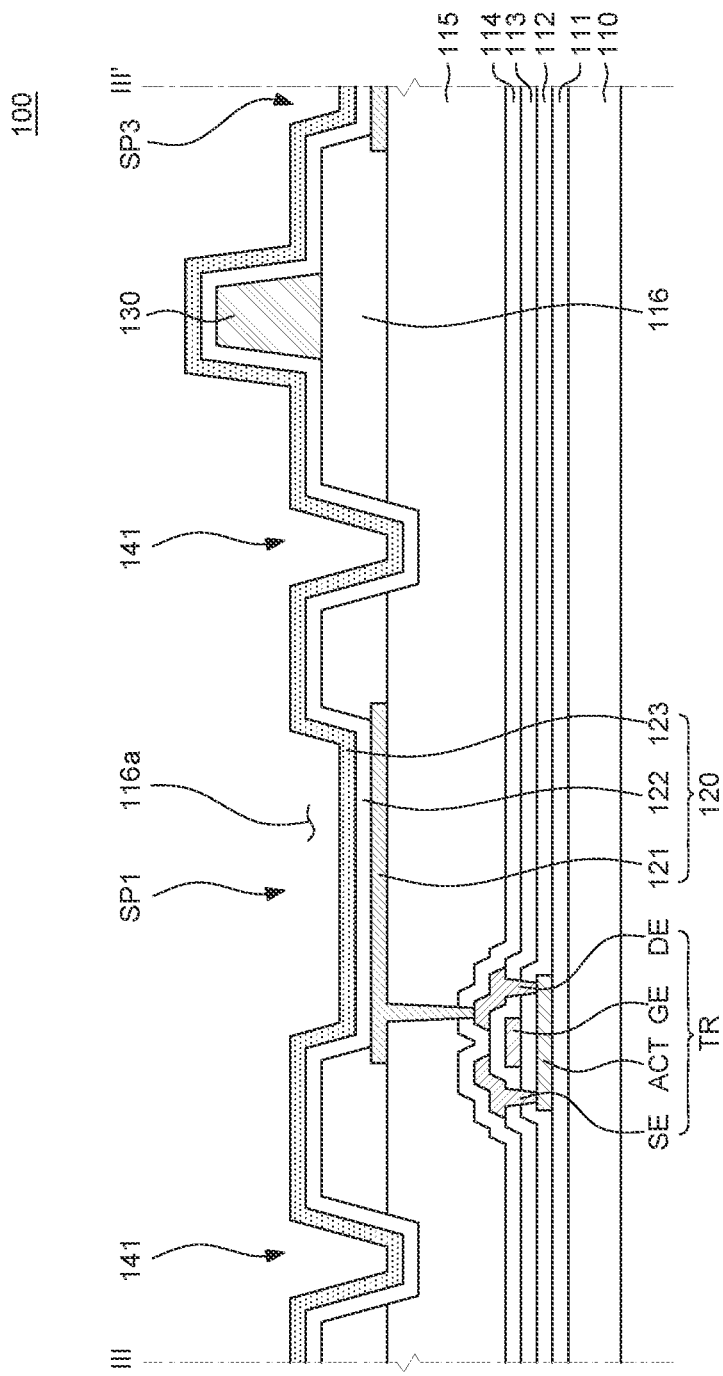

For example, as illustrated in FIG. 3B, when the depth of each of the plurality of trenches 140 is greater than the thickness of the bank 116, the plurality of trenches 140 is formed from the bank 116 to the planarization layer 115 under the bank 116, and a part of the planarization layer 115 can be exposed in the plurality of trenches 140. In this case, since the plurality of trenches 140 does not overlap the plurality of anodes 121, even if the plurality of trenches 140 is formed from the bank 116 to the planarization layer 115, the plurality of anodes covered with the bank 116 may not be partially exposed in the plurality of trenches 140. Accordingly, when the plurality of trenches 140 and the plurality of anodes 121 do not overlap each other, the depth of each of the plurality of trenches 140 can be designed variously, but is not limited thereto.

Meanwhile, the common layers of the plurality of light emitting devices 120 are formed as a single layer over the plurality of sub-pixels SP. In this case, as the light emitting devices 120 of the plurality of sub-pixels SP are formed in a structure that shares the common layer, when a light emitting device 120 of a specific sub-pixel SP emits light, a phenomenon that a current flows to the light emitting devices 120 of adjacent sub-pixels SP, for example, a current leakage phenomenon can occur. In this case, unintended light emitting devices 120 of other sub-pixels SP can emit light due to the leakage current, thereby causing color mixing between the plurality of sub-pixels SP and increasing power consumption. In addition, color abnormalities, spots, or the like can be visually recognized due to the leakage current, and display quality can deteriorate. For example, when only the first sub-pixel SP1 of the plurality of sub-pixels SP emits light, some of the current supplied to drive the light emitting device 120 of the first sub-pixel SP1 can leak to the second sub-pixel SP2 and the third sub-pixel SP3 adjacent to each other through the common layer.

In addition, the light emitting layers separated and disposed for each of the plurality of sub-pixels SP have different turn-on voltages. For example, the turn-on voltage for driving the first sub-pixel SP1 on which the blue light emitting layer is disposed can be the highest, and the turn-on voltage for driving the third sub-pixel SP3 on which the red light emitting layer is disposed can be the lowest. In addition, since a barrier through which a current can flow to the second sub-pixel SP2 or the third sub-pixel SP3 having a lower turn-on voltage than the first sub-pixel SP1 having the highest turn-on voltage is low, the current leaking through the common layer can easily flow from a first sub-pixel SP1 having a high turn-on voltage to a second sub-pixel SP2 and a third sub-pixel SP3 having a low turn-on voltage, and both the second sub-pixel SP2 and the third sub-pixel SP3 having the low turn-on voltage can emit light together when the first sub-pixel SP1 is driven.

In particular, since the luminance of light emitted from the driving sub-pixel SP is low during low-gradation driving, light emitted from the adjacent sub-pixels SP may be more easily recognized. For example, the color abnormalities and spot defects due to the leakage current may be more easily recognized during the low-gradation driving, and thus, the display quality may deteriorate. In addition, when displaying low-gradation white light, the third sub-pixel SP3 having the lowest turn-on voltage emits light first through the common layer, so a reddish phenomenon may occur in which a reddish-white color is displayed instead of pure white.

Accordingly, in the display apparatus 100 according to the exemplary embodiment of the present disclosure, the plurality of trenches 140 can be disposed to minimize the leakage current through the common layer of the light emitting device 120. First, since the organic layers 122 and the cathodes 123 of the plurality of light emitting devices 120 are disposed on the bank 116 in which the plurality of trenches 140 is formed, the organic layers 122 and the cathodes 123 can also be disposed within the plurality of trenches 140. Since the organic layer 122 and the cathode 123 are deposited along the plurality of trenches 140, it is possible to increase a length of a path through which the leakage current flows. For example, the common layer of the organic layer 122, which is the path of the leakage current, is formed along the plurality of trenches 140 and banks 116, so the length of the common layer can increase and the length of the path of the leakage current can increase. Accordingly, the length of the organic layer 122, which is the path through which the leakage current flows, increases by the plurality of trenches 140, so the resistance of the organic layer 122 (the common layer) can increase and the leakage current flowing to the light emitting devices 120 of the adjacent sub-pixels SP can be reduced effectively.

In the display apparatus 100 according to the exemplary embodiment of the present disclosure, the number of the plurality of trenches 140 disposed between the plurality of sub-pixels SP can be variously designed in consideration of the turn-on voltages of the plurality of sub-pixels SP. For example, since the leakage current can most easily flow from the first sub-pixel SP1 having the highest turn-on voltage to the third sub-pixel SP3 having the lowest turn-on voltage, the third sub-pixel SP3 can emit light together when only the first sub-pixel SP1 emits light. Accordingly, the plurality of trenches 140 can be the most disposed between the first sub-pixel SP1 and the third sub-pixel SP3 having the largest difference in the turn-on voltage.

In addition, the number of trenches 140 disposed between the second sub-pixel SP2 and the third sub-pixel SP3 having a relatively small difference in turn-on voltage can be smaller than the number of trenches 140 disposed between the first sub-pixel SP1 and the third sub-pixel SP3. For example, the first trench 141, the third trench 143, and two auxiliary trenches 144 can be disposed between the first sub-pixel SP1 and the third sub-pixel SP3 adjacent to each other in the same row, and one second trench 142 can be disposed or the trench 140 may not be disposed between the first sub-pixel SP1 and the second sub-pixel SP2.

Accordingly, in the display apparatus 100 according to the exemplary embodiment of the present disclosure, the number and disposition of the plurality of trenches 140 can be variously designed in consideration of each of the turn-on voltages of the plurality of sub-pixels SP. As an example, the number of trenches disposed between the blue sub-pixel and the red sub-pixel which are adjacent to each other among the plurality of trenches can be different from the number of trenches disposed between the green sub-pixels which are adjacent to each other among the plurality of trenches. As another example, the number of trenches disposed between the blue sub-pixel and the red sub-pixel which are adjacent to each other among the plurality of trenches can be different from the number of trenches disposed between the blue sub-pixels which are adjacent to each other among the plurality of trenches.

In the display apparatus 100 according to the exemplary embodiment of the present disclosure, the plurality of trenches 140 is spaced apart from each other to form the plurality of open areas OP in which only the bank 116 is disposed, thereby reducing the resistance of the cathode 123. The cathodes 123 of the plurality of light emitting devices 120 can be disposed on the bank 116 in which the plurality of trenches 140 is formed. The length of the cathode 123 formed along the shape of the plurality of trenches 140 can increase by the plurality of trenches 140, and the thickness of cathode 123 can be reduced to increase the resistance of the cathode. The resistance of the cathode 123 can increase as the cathode approaches the plurality of trenches 140, and when the resistance of the cathode 123 increases in the vicinity of the plurality of trenches 140, a uniform voltage can be difficult to be applied to the entire cathode 123 and a luminance deviation can occur.

Accordingly, by forming the plurality of open areas OP by spacing the plurality of trenches 140 apart from each other, the paths through which a voltage is transmitted to the entire cathode 123 can be secured. Therefore, in the display apparatus 100 according to the exemplary embodiment of the present disclosure, the plurality of open areas OP can be disposed, and thus, it is possible to apply a uniform voltage to the entire cathode 123 and reduce the luminance deviation in light emitted from the plurality of light emitting devices 120, respectively.

In the display apparatus 100 according to the exemplary embodiment of the present disclosure, the size of the plurality of open areas OP can be configured differently in consideration of the effect of the leakage current. As the difference in turn-on voltage between the plurality of sub-pixels SP increases, more leakage current may flow, and an unintended light emitting device 120 may emit light. In order to reduce the leakage current from flowing to the adjacent sub-pixels SP, the plurality of trenches 140 can be disposed between the emission areas of the plurality of sub-pixels SP. However, since the cathode 123 can have the luminance deviation due to the increase in resistance as the cathode 123 approaches the plurality of trenches 140, the plurality of open areas OP, which are the paths through which the uniform voltage is applied to the cathode 123, is disposed together, thereby lowering the resistance of the cathode 123 while reducing the leakage current. In this case, the size of the plurality of open areas OP is configured to be small in an area where a relatively large leakage current can flow to reduce the flow of leakage current, and the size of the plurality of open areas OP is configured to be large in an area where a relatively small leakage current can flow to lower the resistance of the cathode 123. For example, since the plurality of second sub-pixels SP2 adjacent to each other in the column direction is subject to a relatively smaller effect from the leakage current than the plurality of third sub-pixels SP3, the open area OP on the upper side of the second sub-pixel SP2 is configured to be larger than the open areas OP on the left and right sides of the second sub-pixel SP2, thereby forming the paths through which the voltage is uniformly transmitted to the entire cathode 123. Accordingly, in the display apparatus 100 according to the exemplary embodiment of the present disclosure, the size of the plurality of open areas OP can be variously designed in consideration of the leakage current due to the turn-on voltages of the plurality of sub-pixels SP.

In the display apparatus 100 according to the exemplary embodiment of the present disclosure, by disposing the auxiliary trench 144 facing the plurality of open areas OP, it is possible to reduce the leakage current from flowing to the adjacent sub-pixels SP. The plurality of open areas OP are areas in which the plurality of trenches 140 is not disposed, and can lower the resistance of the cathode 123 to apply a uniform voltage to the entire cathode 123. However, in the plurality of open areas OP, the resistance of the common layer, which is the path of the leakage current, is also reduced, so the leakage current can be easily transmitted to other sub-pixels SP through the plurality of open areas OP.

Accordingly, in the display apparatus 100 according to the exemplary embodiment of the present disclosure, in order to suppress the leakage current flowing along the plurality of open areas OP from being transmitted to the adjacent sub-pixels SP, the auxiliary trench 144 can be further disposed to correspond to the plurality of open areas OP. The auxiliary trench 144 can be disposed between each of the plurality of first trenches 141, the plurality of second trenches 142, and the plurality of third trenches 143, and thus, can face the open areas OP of the plurality of first trenches 141, the plurality of second trenches 142, and the plurality of third trenches 143. Accordingly, the leakage current flowing through the plurality of open areas OP can be suppressed from flowing to the adjacent sub-pixels SP by the auxiliary trench 144. Therefore, in the display apparatus 100 according to the exemplary embodiment of the present disclosure, the plurality of auxiliary trenches 144 can be disposed to correspond to the plurality of open areas OP to suppress the flow of leakage current which can cause color abnormalities, spots, or the like, thereby improving the display quality.

Figure 4:
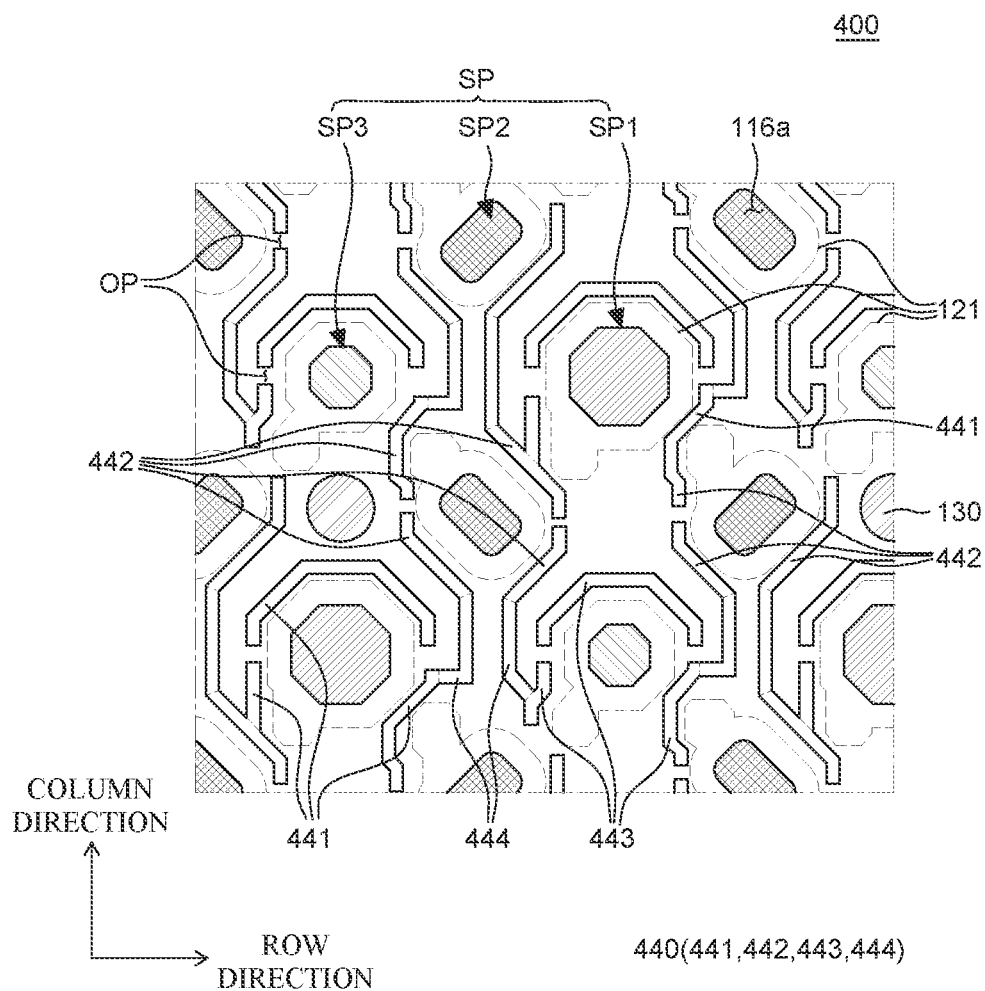
FIG. 4 is an enlarged plan view of a display apparatus according to another exemplary embodiment of the present disclosure.
Figure 5:
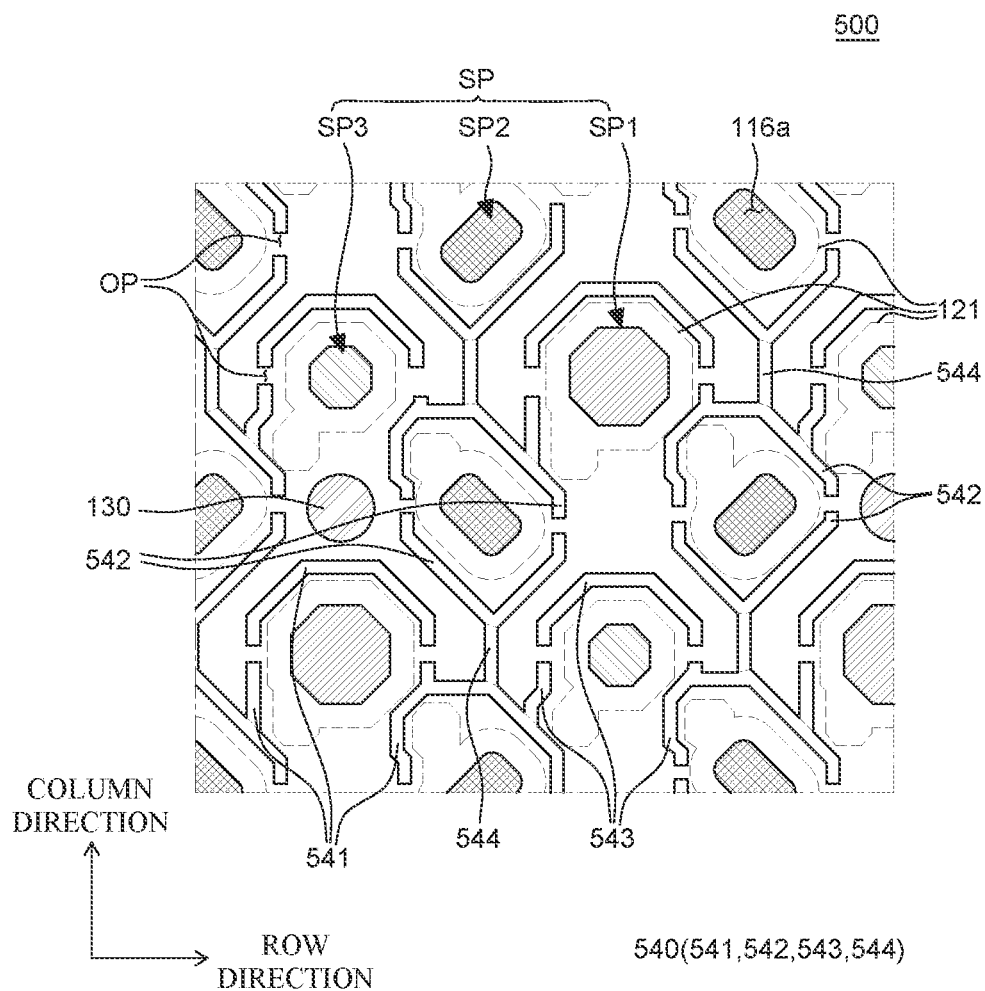
FIG. 5 is an enlarged plan view of a display apparatus according to another exemplary embodiment of the present disclosure.

FIG. 4 is an enlarged plan view of a display apparatus according to another exemplary embodiment of the present disclosure. FIG. 5 is an enlarged plan view of a display apparatus according to another exemplary embodiment of the present disclosure. The display apparatus 400 of FIG. 4 and the display apparatus 500 of FIG. 5 are only different in a plurality of trenches 440 and 540 compared to the display apparatus 100 of FIGS. 1 to 3A, and other components of the display apparatus of FIGS. 4 and 5 are substantially the same as those of FIGS. 1 to 3A, and therefore, a redundant description thereof will be omitted or may be briefly provided.

Referring to FIG. 4, one end and the other (or another) end of the plurality of auxiliary trenches 444 can be connected to different trenches 441, 442, and 443. Each of one end and the other end (or another end0 of the plurality of auxiliary trenches 444 can be connected to any one of the plurality of first trenches 441, the plurality of second trenches 442, and the plurality of third trenches 443. For example, some of the plurality of auxiliary trenches 444 can have one end connected to the plurality of second trenches 442, and the other end (or another end) connected to both the plurality of third trenches 443 and the plurality of second trenches 442. Some of the auxiliary trenches 444 can have one end connected to the second trench 442 corresponding to the right portion of one second sub-pixel SP2, and can be connected to the third trench 443 corresponding to a left portion of the third sub-pixel SP3 disposed on a lower right portion of the one second sub-pixel SP2.

For example, some other of the plurality of auxiliary trenches 444 can have one end connected to the plurality of second trenches 442, and the other end (or another end) connected to both the plurality of first trenches 441 and the plurality of second trenches 442. Specifically, some other of the auxiliary trenches 444 can have one end connected to the second trench 442 corresponding to a left portion of one second sub-pixel SP2, and can be connected to the second trench 442 corresponding to a left portion of the other second sub-pixel SP2 disposed on a lower side of the one second sub-pixel SP2. In this case, the second trench 442 to which the other end of the auxiliary trench 444 is connected can be integrally formed with the first trench 441 surrounding the adjacent first sub-pixels SP1. Accordingly, the other end of some other of the auxiliary trench 444 can be connected to the first trench 441 and the second trench 442 formed integrally.

In this case, the voltage of the cathode 123 can be easily transmitted through the area between the open area OP and the auxiliary trench 444 on the upper and lower sides of the second sub-pixel SP2. For example, it is possible to secure a path through which the voltage of the cathode 123 is easily transmitted through the second sub-pixel SP2, thereby reducing the luminance deviation.

Referring to FIG. 5, one of the auxiliary trenches 544 can be disposed between a first sub-pixel SP1 and a third sub-pixel SP3 adjacent to each other in the same row. In addition, one end and the other end of the auxiliary trench 544 can be connected to a second trench 542 surrounding an upper portion and a lower portion of each of the second sub-pixels SP2 adjacent to each other in the same column. For example, one end of the auxiliary trench 544 can be connected to an intermediate point of one second trench 542 surrounding a lower portion, a lower left portion, and a lower right portion of one second sub-pixel SP2. In addition, the auxiliary trench 544 can extend in a column direction, and thus, the other end thereof can be connected to an intermediate point of another second trench 542 surrounding an upper portion, an upper left portion, and an upper right portion of other second sub-pixels SP2.

In the display apparatuses 400 and 500 according to various exemplary embodiments of the present disclosure, one ends and the other ends of the auxiliary trenches 444 and 544 can each be connected to one ends and the other ends of any one of the plurality of first trenches 441 and 541, the plurality of second trenches 442 and 542, and a plurality of third trenches 443 and 543 which are adjacent to each other, thereby reducing the leakage current flowing between the plurality of sub-pixels SP. For example, in the display apparatus 400 of FIG. 4, one end and the other end of the auxiliary trench 444 can be connected to the second trench 442 adjacent to each other in the same column, or the other end of the auxiliary trench 444 can be connected to the first trench 441 or the third trench 443 adjacent to the auxiliary trench 444. For example, the auxiliary trenches 544 in the display apparatus 500 of FIG. 5 can extend in the column direction between each of the first sub-pixel SP1 and the third sub-pixel SP3 adjacent to each other in the same row, thereby blocking a leakage current flowing from the first sub-pixel SP1 toward the third sub-pixel SP3.

In addition, the auxiliary trench 544 is connected between the second trenches 542 of the second sub-pixels SP2 adjacent to each other in the same column, thereby reducing the leakage current flowing through a space between the second sub-pixels SP2. Accordingly, in the display apparatuses 400 and 500 according to various exemplary embodiments of the present disclosure, the auxiliary trenches 444 and 544 can connect between the plurality of first trenches 441 and 541, the plurality of second trenches 442 and 542, and the plurality of third trenches 443 and 543, thereby reducing the leakage current flowing to the adjacent sub-pixels SP.

Figure 6:
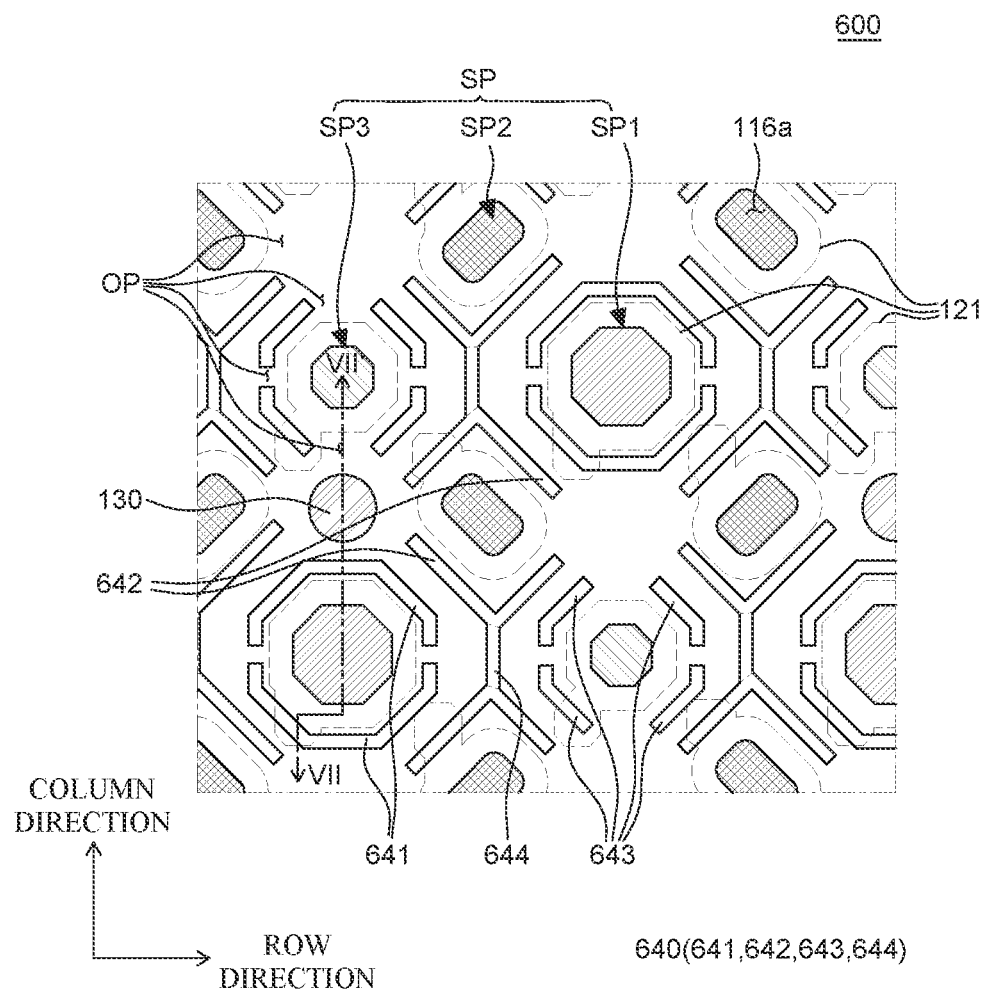
FIG. 6 is an enlarged plan view of a display apparatus according to another exemplary embodiment of the present disclosure.
Figure 7:
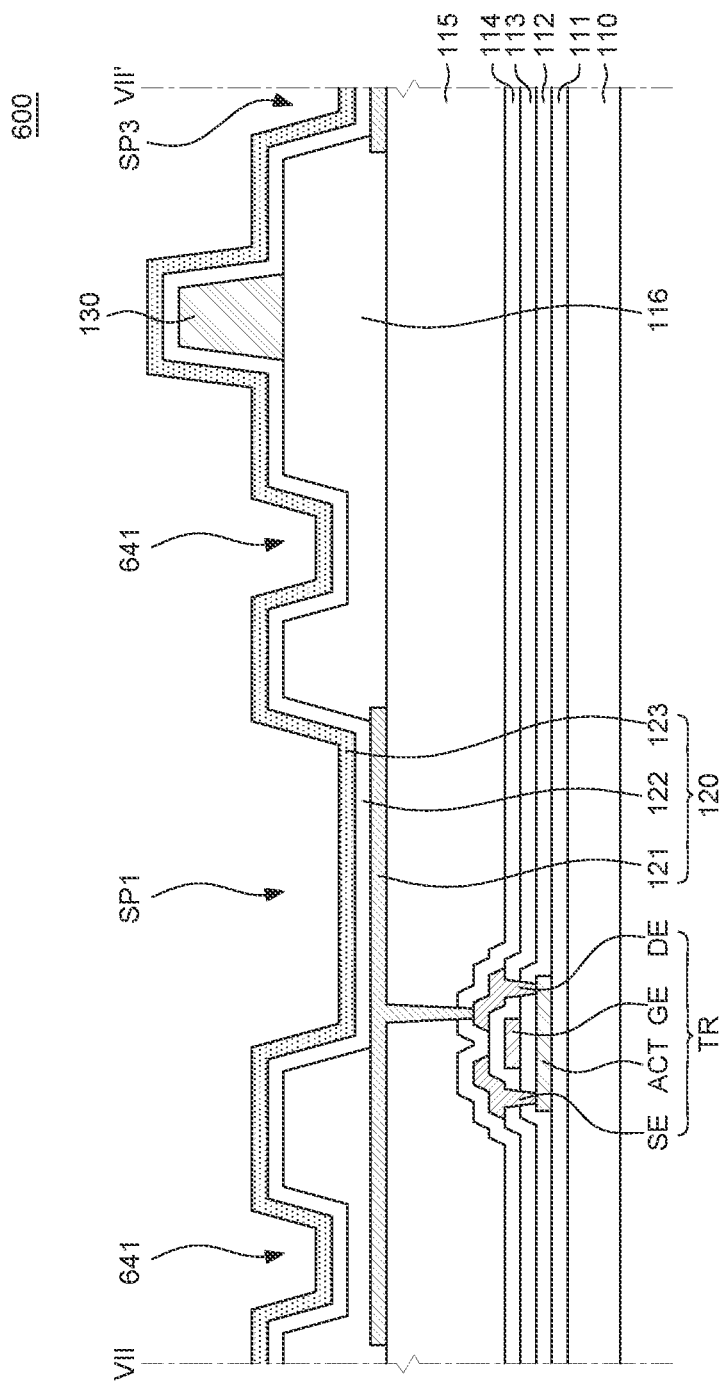
FIG. 7 is a cross-sectional view taken along line VII-VII' of FIG. 6.

FIG. 6 is an enlarged plan view of a display apparatus according to another exemplary embodiment of the present disclosure. FIG. 7 is a cross-sectional view taken along line VII-VII' of FIG. 6. A display apparatus 600 of FIGS. 6 and 7 is different in a plurality of trenches 640 compared with the display apparatus 100 of FIGS. 1 to 3A, and other components are substantially the same, and therefore, a redundant description thereof will be omitted or may be briefly provided.

Referring to FIGS. 6 and 7, a depth of each of the plurality of trenches 640 is smaller than the thickness of the bank 116. In the plurality of trenches 640, the planarization layer 115 under the bank 116 may not be exposed. In this case, the plurality of trenches 640 can be disposed to overlap a part of the anode 121 covered with the bank 116.

Referring to FIG. 6, a plurality of first trenches 641 surrounding each of the plurality of first sub-pixels SP1 is disposed in the bank 116. One of the plurality of first trenches 641 can be disposed to surround the lower portion, the lower left portion, and the lower right portion of the first sub-pixel SP1. In this case, one first trench 641 can be disposed to overlap a part of the anode 121 of the first sub-pixel SP1.

A plurality of second trenches 642 surrounding each of the plurality of second sub-pixels SP2 is disposed in the bank 116. One of the plurality of second trenches 642 can be disposed to surround the upper portion, the upper left portion, and the upper right portion of the second sub-pixel SP2. In this case, one second trench 642 can be disposed to overlap a part of the anode 121 of the second sub-pixel SP2.

A plurality of third trenches 643 surrounding each of the plurality of third sub-pixels SP3 is disposed in the bank 116. One of the plurality of third trenches 643 can be disposed to surround the lower left portion and a part of the lower side of the third sub-pixel SP3, for example, a corner portion of the lower left portion of the third sub-pixel SP3. In this case, one third trench 643 can be disposed to overlap a part of the anode 121 of the third sub-pixel SP3.

In the display apparatus 600 according to another exemplary embodiment of the present disclosure, the depth of each of the plurality of trenches 640 is formed to be smaller than the thickness of the bank 116, so the plurality of trenches 640 can be variously designed without being limited in the shape and disposition of the anode 121. Even if the plurality of trenches 640 is disposed to overlap a part of the anode 121 covered with the bank 116, since the depth of the plurality of trenches 640 is smaller than the thickness of the bank 116, the anode 121 may not be exposed in the plurality of trenches 640. Therefore, even if the plurality of trenches 640 overlaps the anode 121, the organic layer 122 and the cathode 123 formed on the front surface of the substrate 110 can be in contact with the anode 121 only at an opening 116a of the bank 116, and can emit light only in the plurality of sub-pixels SP. Accordingly, by adjusting the depth of the plurality of trenches 640, the disposition of the plurality of trenches 640 can be variously designed regardless of the disposition of the anode 121.

Figure 8:
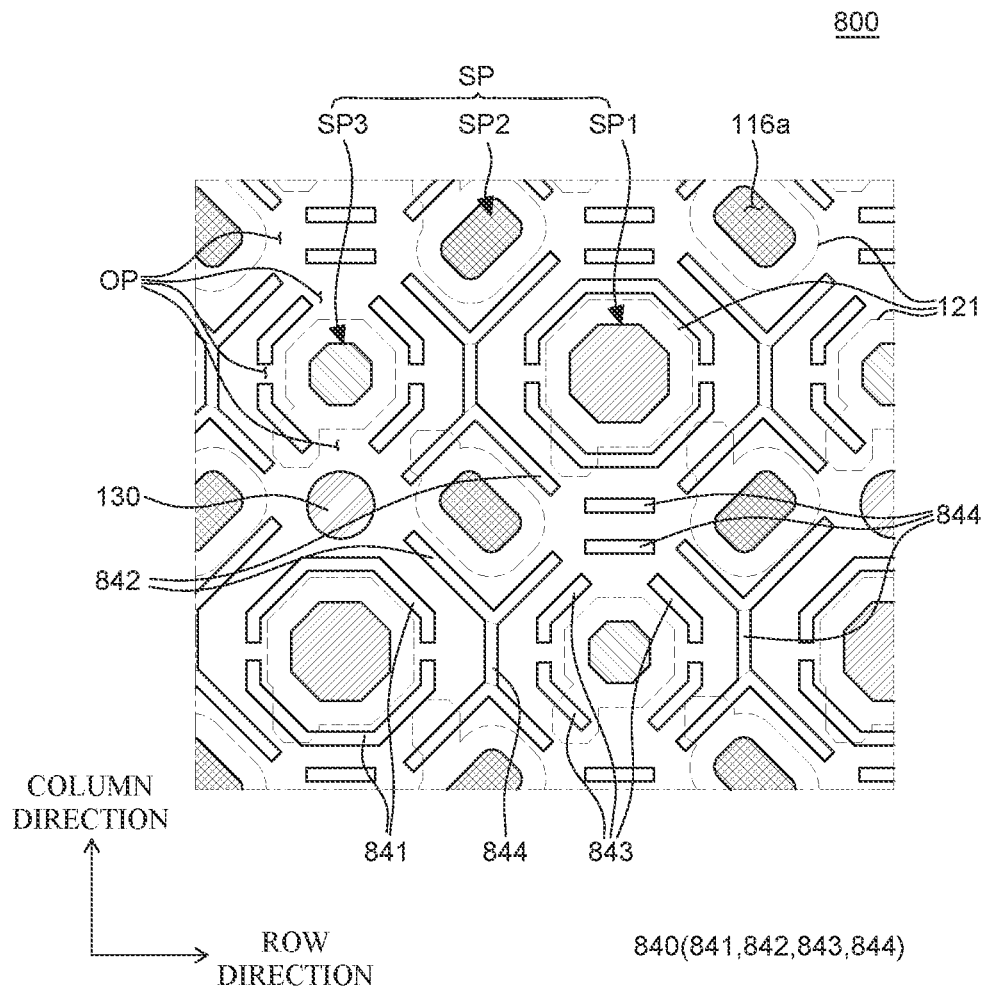
FIG. 8 is an enlarged plan view of a display apparatus according to another exemplary embodiment of the present disclosure.

FIG. 8 is an enlarged plan view of a display apparatus according to another exemplary embodiment of the present disclosure. A display apparatus 800 of FIG. 8 is different in a plurality of trenches 840 compared with the display apparatus 600 of FIGS. 6 and 7, and other components are substantially the same, and therefore, a redundant description thereof will be omitted or may be briefly provided.

Referring to FIG. 8, a plurality of auxiliary trenches 844 are further disposed between the plurality of sub-pixels SP. For example, two auxiliary trenches 844 can be disposed between the first sub-pixel SP1 and the third sub-pixel SP3 adjacent to each other in the same column. For example, the plurality of auxiliary trenches 844 can be disposed in a row direction between the first sub-pixel SP1 and the third sub-pixel SP3 adjacent to each other in the same column and between the second sub-pixels SP2 adjacent to each other in the same row. In addition, the plurality of auxiliary trenches 844 can be disposed in the remaining areas except for the area in which the spacer 130 between the first sub-pixel SP1 and the third sub-pixel SP3 is disposed.

At least some of the plurality of auxiliary trenches 844 can be disposed to be spaced apart from a plurality of first trenches 841, a plurality of second trenches 842, and a plurality of third trenches 843. Some of the plurality of auxiliary trenches 844 can be disposed in an island shape. Some of the plurality of auxiliary trenches 844 can be disposed to be spaced apart from a plurality of first trenches 841, a plurality of second trenches 842, and a plurality of third trenches 843, thereby securing paths through which a voltage can be easily transmitted to the entire cathode 123. For example, a uniform voltage can be applied to the entire cathode 123 along the auxiliary trenches 844 disposed to be spaced apart from the open areas OP of the left and right portions of the second sub-pixel SP2.

In the display apparatus 800 according to another exemplary embodiment of the present disclosure, the plurality of auxiliary trenches 844 is disposed in an empty space between the first sub-pixel SP1 and the third sub-pixel SP3 and between the second sub-pixel SP2 and the second sub-pixel SP2, thereby applying a uniform voltage to the entire cathode 123 while minimizing a leakage current. The plurality of auxiliary trenches 844 can be further disposed in the remaining area except for the area in which the spacer 130 is disposed among the areas between the first sub-pixel SP1 and the third sub-pixel SP3 and between the second sub-pixels SP2. The plurality of auxiliary trenches 844 is disposed in a row direction between the first sub-pixel SP1 and the third sub-pixel SP3 having the largest difference in a turn-on voltage, thereby minimizing a leakage current flowing from the first sub-pixel SP1 toward the third subpixel SP3, in a case that the first sub-pixel and the third sub-pixel are disposed in the same column.

In addition, the plurality of auxiliary trenches 844 can be spaced apart from each of the plurality of first trenches 841, the plurality of second trenches 842, and the plurality of third trenches 843, so open areas can be formed and an area in which the resistance of the cathode 123 is relatively low can be formed so that a uniform voltage can be applied to the entire cathode 123 together with the open areas OP corresponding to each of the left and right portions of the second sub-pixel SP2. Accordingly, in the display apparatus 800 according to another exemplary embodiment of the present disclosure, a plurality of island-shaped auxiliary trenches 844 extending in the row direction can be disposed between the first sub-pixel SP1 and the third sub-pixel SP3 adjacent to each other in the column direction, thereby applying the uniform voltage to the entire cathode 123 while minimizing the leakage current.

Figure 9:
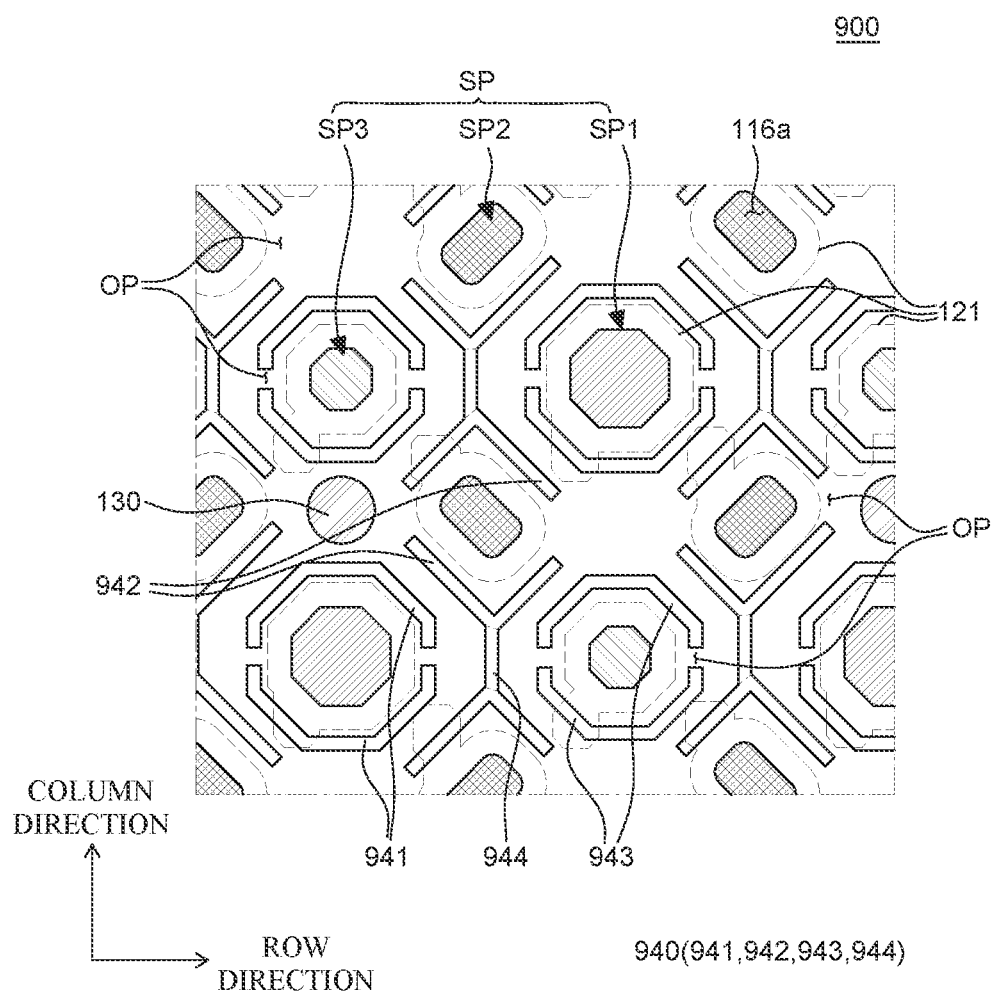
FIG. 9 is an enlarged plan view of a display apparatus according to another exemplary embodiment of the present disclosure.

FIG. 9 is an enlarged plan view of a display apparatus according to another exemplary embodiment of the present disclosure. A display apparatus 900 of FIG. 9 is different in a plurality of trenches 940 compared with the display apparatus 600 of FIGS. 6 and 7, and other components are substantially the same, and therefore, a redundant description thereof will be omitted or may be briefly provided.

Referring to FIG. 9, a plurality of third trenches 943 can be disposed to surround an upper portion and a lower portion of each of the plurality of third sub-pixels SP3. Specifically, compared to the display apparatus 600 of FIGS. 6 and 7, in the display apparatus 900 of FIG. 9, a plurality of third trenches 943 surrounding one third sub-pixel SP3 can include a third trench 943 covering an upper portion, an upper left portion, and an upper right portion of the third sub-pixel SP3, and a third trench 943 covering a lower portion, a lower left portion, and a lower right portion of the third sub-pixel SP3. Accordingly, a plurality of open areas OP can be disposed only in left and right portions of each of the plurality of third sub-pixels SP3.

In the display apparatus 900 according to another exemplary embodiment of the present disclosure, open areas OP of each of the plurality of third sub-pixels SP3 having the lowest turn-on voltage can be minimized to minimize a leakage current flowing to the plurality of third sub-pixels SP3. The plurality of third sub-pixels SP3 having the lowest turn-on voltage can emit light relatively easily due to the leakage current. For example, when only the first sub-pixel SP1 emits light, the third sub-pixel SP3 having the lowest turn-on voltage due to the leakage current can emit light first. Therefore, by minimizing a spacing between the plurality of third trenches 943 surrounding each of the third sub-pixels SP3, which are most vulnerable to the leakage current, for example, a size of the open area OP, it is possible to minimize the effect of the leakage current on the plurality of third sub-pixels SP3.

Figure 10:
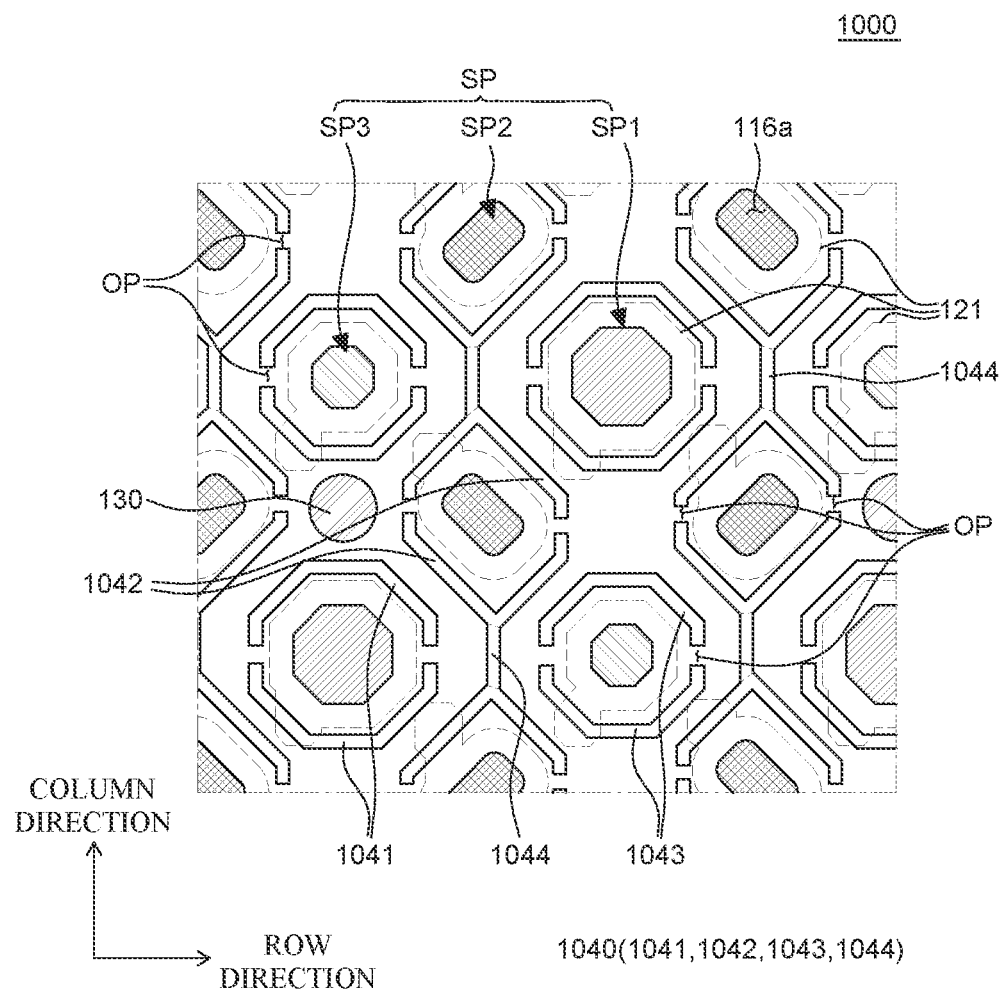
FIG. 10 is an enlarged plan view of a display apparatus according to another exemplary embodiment of the present disclosure.

FIG. 10 is an enlarged plan view of a display apparatus according to another exemplary embodiment of the present disclosure. A display apparatus 1000 of FIG. 10 is different in a plurality of trenches 1040 compared with the display apparatus 900 of FIG. 9, and other components are substantially the same, and therefore, a redundant description thereof will be omitted or may be briefly provided.

Referring to FIG. 10, the size of the open area OP corresponding to left and right portions of each of the plurality of second sub-pixels SP2 can be minimized. Specifically, compared to the display apparatus 900 of FIG. 9, in the display apparatus 1000 of FIG. 10, the spacing of the plurality of second trenches 1042 in the left and right portions of each of the plurality of second sub-pixels SP2 is configured to be narrow, so the size of the open area OP can be reduced.

In the display apparatus 1000 according to another exemplary embodiment of the present disclosure, the open areas OP of each of the plurality of second sub-pixels SP2 can be minimized to minimize a leakage current flowing to the plurality of second sub-pixels SP2. The plurality of second sub-pixels SP2 having a turn-on voltage lower than that of the plurality of first sub-pixels SP1 can emit light due to the leakage current. For example, when only the first sub-pixel SP1 emits light, the second sub-pixel SP2 having a lower turn-on voltage than the first sub-pixel SP1 can emit light due to the leakage current. Therefore, it is possible to minimize the size of the open area OP by narrowing the spacing between the plurality of second trenches 1042 surrounding each of the second sub-pixels SP2, and it is possible to minimize the light emission of the plurality of second sub-pixels SP2 in the unintended situation due to the leakage current.

Figure 11:
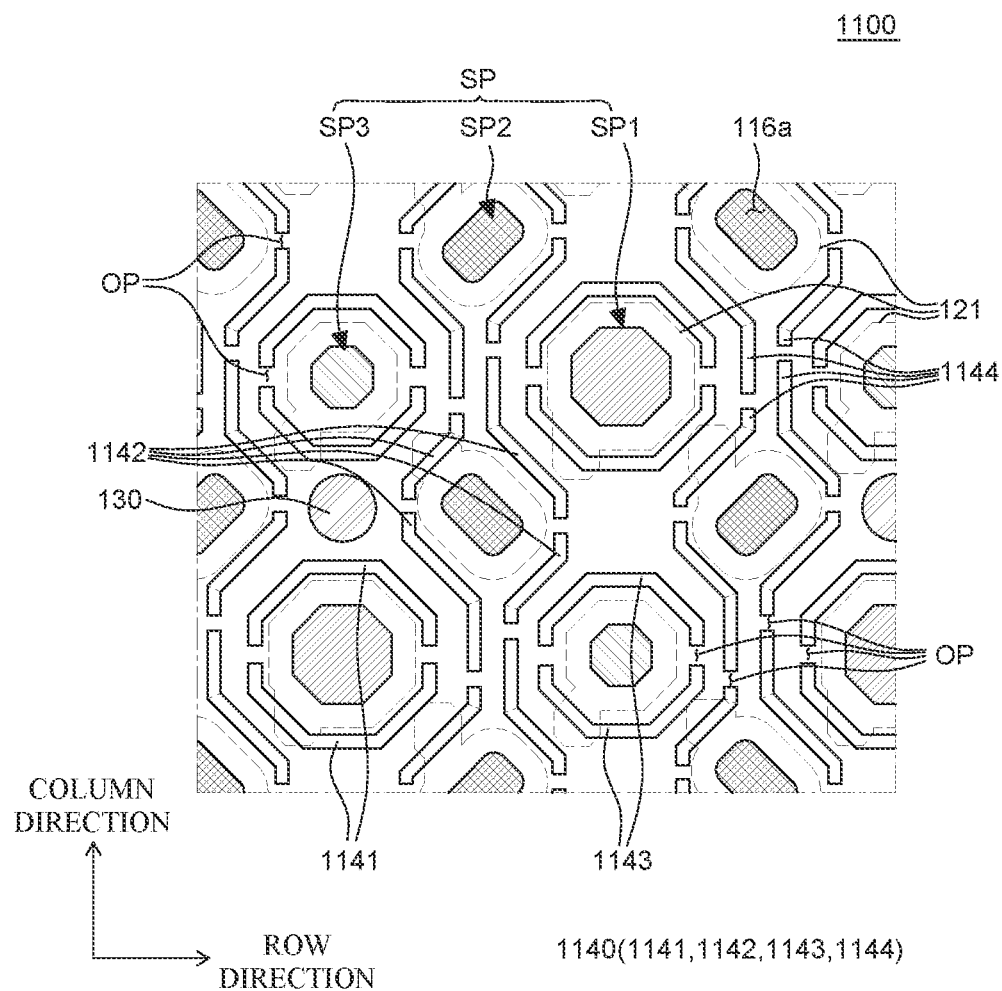
FIG. 11 is an enlarged plan view of a display apparatus according to another exemplary embodiment of the present disclosure.

FIG. 11 is an enlarged plan view of a display apparatus according to another exemplary embodiment of the present disclosure. A display apparatus 1100 of FIG. 11 is different in a plurality of trenches 1140 compared with the display apparatus 600 of FIGS. 6 and 7, and other components are substantially the same, and therefore, a redundant description thereof will be omitted or may be briefly provided.

Referring to FIG. 11, open areas OP are disposed in left and right portions of the plurality of first sub-pixels SP1, respectively. The open areas OP are disposed in the left and right portions of the plurality of third sub-pixels SP3, respectively.

A plurality of auxiliary trenches 1144 extending in a column direction from the plurality of second trenches 1142 is disposed between the plurality of first sub-pixels SP1 and the plurality of third sub-pixels SP3 adjacent to each other in a row direction. The open areas OP are disposed in each of the plurality of auxiliary trenches 1144 between the plurality of first sub-pixels SP1 and the plurality of third sub-pixels SP3 adjacent to each other in the row direction.

Among the open areas OP between the plurality of auxiliary trenches 1144, the open area OP adjacent to the right portion of the first sub-pixel SP1 can be alternately disposed to an open area OP corresponding to the right portion of the first sub-pixel SP1. For example, the open area OP of the auxiliary trenches 1144 most adjacent to the right portion of the first sub-pixel SP1 can be adjacently disposed to a lower side in the column direction than the open area OP of the right portion of the first sub-pixel SP1. For example, the open area OP of the right portion of the first sub-pixel SP1 and the open area OP of the auxiliary trench 1144 most adjacent to the open area OP of the right portion of the first sub-pixel SP1 may not be disposed on the same line in the row direction, but can be interlacingly disposed.

Among the open area OP between the plurality of auxiliary trenches 1144, the open area OP adjacent to the left portion of the third sub-pixel SP3 can be interlacingly disposed to the open area OP corresponding to the left portion of the third sub-pixel SP3. For example, the open area OP of the auxiliary trenches 1144 most adjacent to the left portion of the third sub-pixel SP3 can be adjacently disposed to an upper side in the column direction than the open area OP of the left portion of the third sub-pixel SP3. For example, the open area OP of the auxiliary trench 1144 most adjacent to the open area OP of the left portion of the third sub-pixel SP3 and the open area OP of the left portion of the third sub-pixel SP3 may not be disposed on the same line in the row direction, but can be interlacingly disposed.

In this case, the open areas OP of the auxiliary trenches 1144 that are adjacent to each other can also be interlacingly disposed. For example, among a pair of auxiliary trenches 1144 disposed between the right side of the first sub-pixel SP1 and the left side of the third sub-pixel SP3, the open area OP of the auxiliary trench 1144 most adjacent to the right side of the first sub-pixel SP1 can be adjacent to the lower side in the column direction, and the open area OP of the auxiliary trench 1144 most adjacent to the left side of the third sub-pixel SP3 can be adjacently disposed to the upper side in the column direction. Accordingly, the open areas OP of the auxiliary trenches 1144 that are adjacent to each other may also not be disposed on the same line, and can be interlacingly disposed.

In the display apparatus 1100 according to another exemplary embodiment of the present disclosure, a plurality of open areas OP adjacent to each other can be interlacingly disposed to minimize a leakage current. The open area OP of the auxiliary trench 1144 adjacent to the right portion of the first sub-pixel SP1 can be disposed more adjacent to the lower portion of the first sub-pixel SP1, and thus, can be interlacingly disposed to the open area OP of the right portion of the first sub-pixel SP1. In addition, the open area OP of the auxiliary trench 1144 adjacent to the left portion of the third sub-pixel SP3 can be disposed more adjacent to the upper portion of the third sub-pixel SP3, and thus, can be interlacingly disposed to the open area OP in the left portion of the third sub-pixel SP3. Accordingly, it is possible to minimize leakage current flowing between the first sub-pixel SP1 and the third sub-pixel SP3 by interlacingly disposing each of the open areas OP adjacent to each other, and minimize the color abnormalities and the deterioration of the display quality due to the leakage current.

Figure 12:
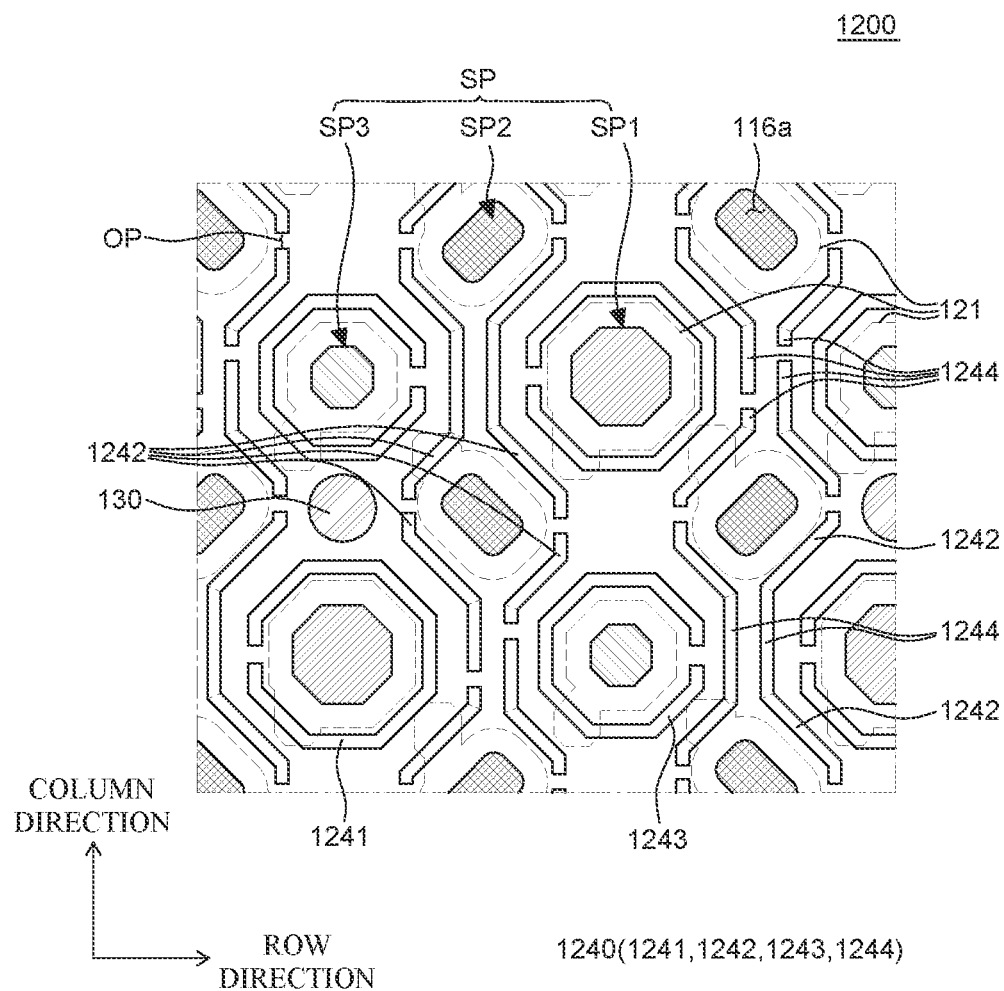
FIG. 12 is an enlarged plan view of a display apparatus according to another exemplary embodiment of the present disclosure.

FIG. 12 is an enlarged plan view of a display apparatus according to another exemplary embodiment of the present disclosure. A display apparatus 1200 of FIG. 12 is different in a plurality of trenches 1240 compared with the display apparatus 1100 of FIG. 11, and other components are substantially the same, and therefore, a redundant description thereof will be omitted or may be briefly provided.

Referring to FIG. 12, one first trench 1241 can be disposed surrounding an upper portion, a right portion, a lower portion, an upper left portion, and a lower left portion of each of the plurality of first sub-pixels SP1, respectively. Accordingly, the open area OP can be disposed only in a left portion of each of the plurality of first sub-pixels SP1.

A plurality of second trenches 1242 can be disposed surrounding each of the four corner portions of each of the plurality of second sub-pixels SP2, respectively. Accordingly, the open area OP can be disposed in the upper portion, the lower portion, the left portion, and the right portion of the second sub-pixel SP2, respectively.

One third trench 1243 can be disposed surrounding the upper portion, the left portion, the lower portion, the upper right portion, and the lower right portion of each of the plurality of third sub-pixels SP3, respectively. Accordingly, the open area OP can be disposed only in the right portion of each of the plurality of third sub-pixels SP3, respectively.

The open area OP can be formed only in some of the auxiliary trenches 1244 among the plurality of trenches 1240 disposed between the first sub-pixel SP1 and the third sub-pixel SP3 adjacent to each other in the same row. For example, each of the plurality of auxiliary trenches 1244 disposed on the right side of the first sub-pixel SP1 can be spaced apart from each other to form the open area OP. Therefore, each of the plurality of auxiliary trenches 1244 disposed on the left side of the first sub-pixel SP1 can be connected to each other, and thus, the open area OP may not be formed.

In the display apparatus 1200 according to another exemplary embodiment of the present disclosure, by minimizing the plurality of open areas OP, it is possible to minimize the leakage current transmitted to the adjacent sub-pixels SP. The plurality of trenches 1240 surrounding each of the plurality of sub-pixels SP can be spaced apart from each other to dispose the opened open area OP to a minimum. For example, by disposing only one first trench 1241 surrounding the first sub-pixel SP1, only one open area OP can be formed in the left portion of the first sub-pixel SP1, and only one third trench 1243 surrounding the third sub-pixel SP3 can be disposed surrounding the third sub-pixel SP3 to form only one open area OP in the right portion of the third sub-pixel SP3. In addition, the open areas OP can be formed only in some of the plurality of auxiliary trenches 1244 disposed between the plurality of first sub-pixel SP1 and the plurality of third sub-pixel SP3. Therefore, when only some of the plurality of sub-pixels SP emit light by disposing the open area OP in the plurality of trenches 1240 to a minimum, it is possible to minimize light emission from the unintended sub-pixel SP due to the leakage current flowing to the adjacent sub-pixels SP. Therefore, in the display apparatus 1200 according to another exemplary embodiment of the present disclosure, the plurality of trenches 1240 is spaced apart from each other and the opened open areas OP are arranged to a minimum to improve spots or color abnormalities due to the leakage current.

Figure 13:
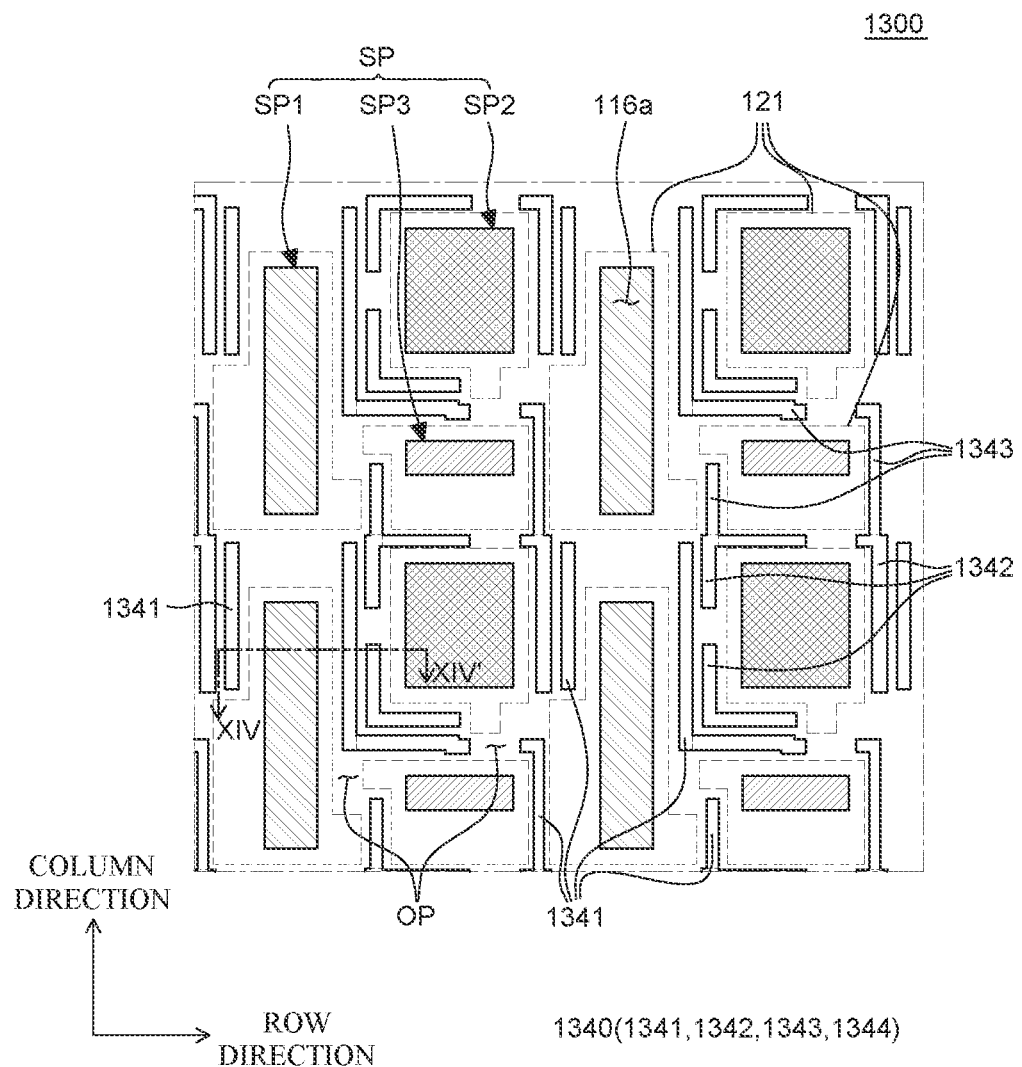
FIG. 13 is an enlarged plan view of a display apparatus according to another exemplary embodiment of the present disclosure.
Figure 14:
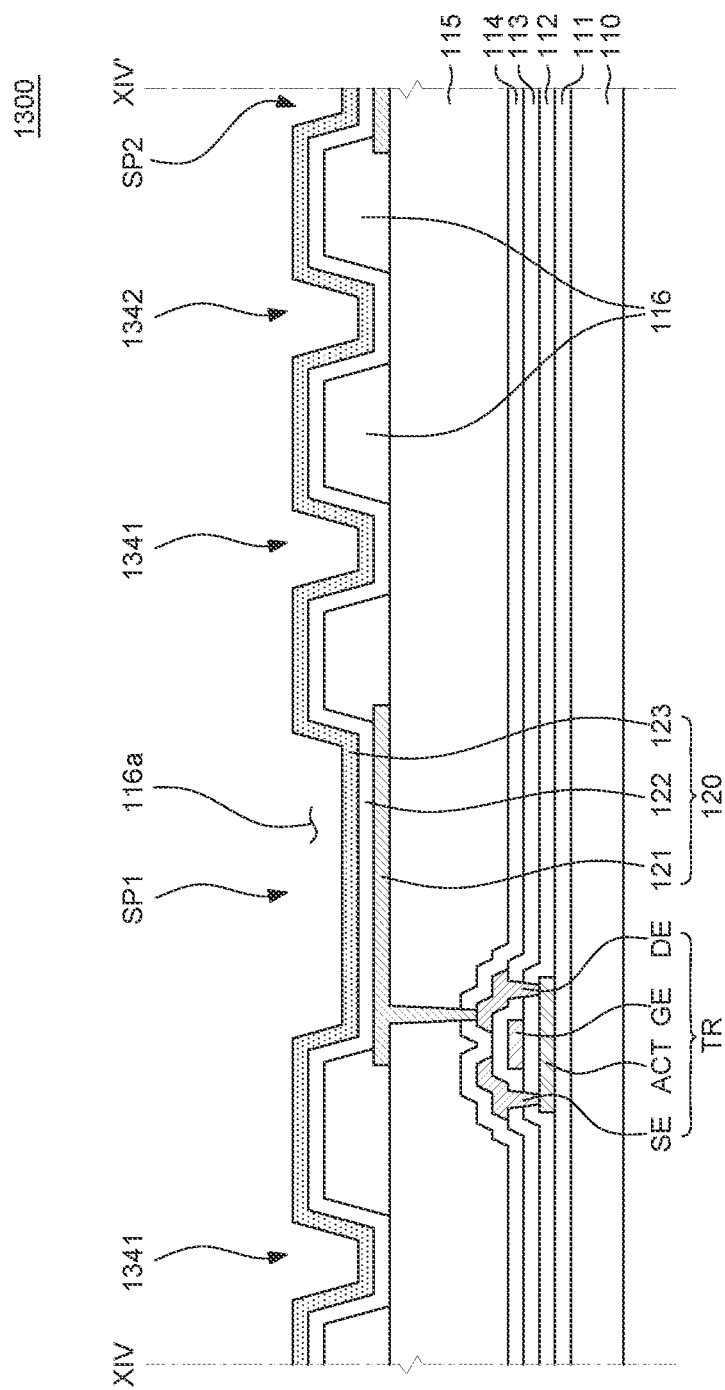
FIG. 14 is a cross-sectional view taken along line XIV-XIV' of FIG. 13.

FIG. 13 is an enlarged plan view of a display apparatus according to another exemplary embodiment of the present disclosure. FIG. 14 is a cross-sectional view taken along line XIV-XIV' of FIG. 13. A display apparatus 1300 of FIGS. 13 and 14 is different in a plurality of sub-pixels SP and a plurality of trenches 1340 compared with the display apparatus 100 of FIGS. 1 to FIG. 3A, and other components are substantially the same, and therefore, a redundant description thereof will be omitted or may be briefly provided.

Referring to FIG. 13, the plurality of sub-pixels SP includes a plurality of first sub-pixels SP1, a plurality of second sub-pixels SP2, and a plurality of third sub-pixels SP3.

The plurality of first sub-pixels SP1 can be disposed in a plurality of columns. The plurality of first sub-pixels SP1 can be disposed in the same column. The plurality of second sub-pixels SP2 and the plurality of third sub-pixels SP3 can be disposed between each of the plurality of columns in which the plurality of first sub-pixels SP1 is disposed. For example, the plurality of first sub-pixels SP1 can be disposed in one column, and the plurality of second sub-pixels SP2 and the plurality of third sub-pixels SP3 can be disposed in adjacent columns. In addition, the plurality of second sub-pixels SP2 and the plurality of third sub-pixels SP3 can be alternately disposed in the same column.

The plurality of trenches 1340 includes a plurality of first trenches 1341, a plurality of second trenches 1342, and a plurality of third trenches 1343.

The plurality of first trenches 1341 is disposed to surround the plurality of first sub-pixels SP1, respectively. The plurality of first trenches 1341 can be disposed to correspond to edges of each of the plurality of first sub-pixels SP1. The plurality of first trenches 1341 can be disposed along edges of the anodes 121 disposed in the plurality of first sub-pixels SP1.

For example, one first trench 1341 of the plurality of first trenches 1341 can be disposed to correspond to an upper left portion of the first sub-pixel SP1. One first trench 1341 can include a portion extending in a column direction to correspond to the upper left portion of the first sub-pixel SP1.

For example, the other first trench 1341 of the plurality of first trenches 1341 can be disposed to correspond to a lower left portion of the first sub-pixel SP1. The other first trench 1341 can include a portion extending in a column direction to correspond to the lower left portion of the first sub-pixel SP1.

For example, another first trench 1341 of the plurality of first trenches 1341 can be disposed to correspond to an upper right portion and a lower right portion of the first sub-pixel SP1, respectively. Another first trench 1341 can include a portion extending in a column direction to correspond to the upper right portion and the lower right portion of the first sub-pixel SP1, respectively.

The plurality of second trenches 1342 is disposed to surround each of the plurality of second sub-pixels SP2. The plurality of second trenches 1342 can be disposed to correspond to edges of each of the plurality of second sub-pixels SP2. The plurality of second trenches 1342 can be disposed along edges of the anodes 121 disposed in the plurality of second sub-pixels SP2.

For example, one second trench 1342 of the plurality of second trenches 1342 can be disposed to correspond to an upper left portion and a part of an upper side adjacent to the left portion of the second sub-pixel SP2. One second trench 1342 can include portions extending in a column direction and a row direction to correspond to a left portion and an upper portion of the second sub-pixel SP2, respectively.

For example, the other second trench 1342 of the plurality of second trenches 1342 can be disposed to correspond to a lower left portion and a part of a lower portion adjacent to the left portion of the second sub-pixel SP2. The other second trench 1342 can include portions extending in the column direction and the row direction to correspond to the left portion and the lower portion of the second sub-pixel SP2, respectively.

For example, another second trench 1342 of the plurality of second trenches 1342 can be disposed to correspond to a right portion and a part of an upper portion adjacent to the right portion of the second sub-pixel SP2. Another second trench 1342 can include portions extending in a column direction and a row direction to correspond to the right portion and the upper portion of the second sub-pixel SP2, respectively.

The plurality of third trenches 1343 is disposed to surround each of the plurality of third sub-pixels SP3. The plurality of third trenches 1343 can be disposed to correspond to edges of each of the plurality of third sub-pixels SP3. The plurality of third trenches 1343 can be disposed along edges of the anodes 121 disposed in the plurality of third sub-pixels SP3.

For example, one third trench 1343 of the plurality of third trenches 1343 can be disposed to correspond to a lower left portion and a part of a lower portion adjacent to the left portion of the third sub-pixel SP3. One third trench 1343 can include a portion extending in the column direction and a portion extending in the row direction to correspond to the left portion and the lower portion of the third sub-pixel SP3, respectively.

For example, the other third trench 1343 of the plurality of third trenches 1343 can be disposed to correspond to a part of an upper portion of the third sub-pixel SP3. The other third trench 1343 can include a portion extending in a row direction to correspond to the upper portion of the third sub-pixel SP3.

For example, another third trench 1343 of the plurality of third trenches 1343 can be disposed to correspond to a right portion and a part of an upper portion and a part of a lower portion adjacent to the right portion of the third sub-pixel SP3. Another third trench 1343 can include a portion extending in a column direction to correspond to the right portion of the third sub-pixel SP3 and a portion extending in a row direction to correspond to the upper portion and the lower portion thereof.

Meanwhile, at least some of the plurality of first trenches 1341, the plurality of second trenches 1342, and the plurality of third trenches 1343 can be connected to each other. For example, the first trench 1341 disposed in the lower left portion of the first sub-pixel SP1, the second trench 1342 disposed in the right portion of the second sub-pixel SP2, and the third trench 1343 disposed in the right portion of the third sub-pixel SP3 can be formed integrally. For example, the first trench 1341 disposed in the upper right portion of the first sub-pixel SP1 and the third trench 1343 disposed in a part of the upper portion of the third sub-pixel SP3 are formed integrally. For example, the first trench 1341 disposed in the lower right portion of the first sub-pixel SP1, the second trench 1342 disposed in the upper left portion and a part of the upper portion of the second sub-pixel SP2, and the third trench 1343 disposed in the lower left portion and a part of the lower portion of the third sub-pixel SP3 can be formed integrally.

The plurality of open areas OP which is opened to be spaced apart from each other is disposed in each of the plurality of trenches 1340. The plurality of open areas OP are areas between the plurality of first trenches 1341, the plurality of second trenches 1342, and the plurality of third trenches 1343, and can have only the bank 116 disposed therein. The plurality of open areas OP can lower the resistance of the cathode 123 so that a uniform voltage can be applied to the entire cathode 123 disposed on a front surface of the substrate 110. Specifically, the resistance of the cathode 123 can increase as the cathode 123 approaches the plurality of trenches 1340, and when the resistance of the cathode 123 increases, it can be difficult to apply a uniform voltage to the entire cathode 123. Accordingly, by forming the plurality of open areas OP in which only the bank 116 is disposed, it is possible to lower the resistance of the cathode 123 and easily transmit a voltage to the entire cathode 123.

For example, the plurality of open areas OP can be disposed to correspond to the entire upper portion, the entire lower portion, a part of the left portion, and a part of the right portion of each of the plurality of first sub-pixels SP1. In this case, even if the open area OP is formed in the entire upper portion and the lower portion of each of the plurality of first sub-pixels SP1, the plurality of first sub-pixels SP1 is disposed in the same column, so the problem due to the leakage current does not occur.

For example, the plurality of open areas OP can be disposed to correspond to a part of the upper portion, a part of the left portion, and a part of the lower portion of each of the plurality of second sub-pixels SP2. For example, the plurality of open areas OP can be disposed to correspond to a part of the upper side, a part of the left side, and a part of the lower side of each of the plurality of third sub-pixels SP3.

Referring to FIG. 14, the depth of each of the plurality of trenches 1340 can be the same as the thickness of the bank 116. In the plurality of trenches 1340, a top surface of the planarization layer 115 under the bank 116 can be exposed. In this case, the plurality of trenches 1340 can be disposed according to the shape of the plurality of anodes 121 and may not overlap the plurality of anodes 121. When the plurality of trenches 1340 overlaps the plurality of anodes 121, the plurality of anodes 121 covered with the bank 116 can be partially exposed from the bank 116, and a part of the exposed anode 121 can be in contact with the light emitting layer and the cathode 123 formed on the front surface of the substrate 110 so that light can be emitted from locations other than the emission areas of the plurality of sub-pixels SP. Accordingly, the plurality of trenches 1340 can be formed not to overlap the plurality of anodes 121 while being formed along the edges of each of the plurality of anodes 121.

Meanwhile, FIG. 14 illustrates that the depth of each of the plurality of trenches 1340 is the same as the thickness of the bank 116, but the depth of each of the plurality of trenches 1340 can be formed to be larger than the thickness of the bank 116. Since the plurality of trenches 1340 does not overlap the plurality of anodes 121, even if the plurality of trenches 1340 is formed from the bank 116 to the planarization layer 115 under the bank 116, the anode covered with the bank 116 may not be partially exposed in the plurality of trenches 1340. Accordingly, when the plurality of trenches 1340 and the plurality of anodes 121 do not overlap each other, the depth of the plurality of trenches 1340 can be designed variously, but is not limited thereto.

In the display apparatus 1300 according to another exemplary embodiment of the present disclosure, the plurality of trenches 1340 can be variously designed to correspond to designs of the plurality of sub-pixels SP. The plurality of first sub-pixels SP1 among the plurality of sub-pixels SP can be disposed in a plurality of columns. The plurality of second sub-pixels SP2 among the plurality of sub-pixels SP can be disposed between each of the columns in which the plurality of first sub-pixels SP1 is disposed. The plurality of third sub-pixels SP3 can be disposed in a column in which the plurality of second sub-pixels SP2 is disposed, and the plurality of second sub-pixels SP2 and the plurality of third sub-pixels SP3 can be alternately disposed in the same column. In this case, each of the plurality of trenches 1340 can be designed according to the disposition and shape of the plurality of sub-pixels SP. For example, the plurality of first trenches 1341 can disposed along edges of each of the plurality of first sub-pixels SP1, the plurality of second trenches 1342 can be disposed along edges of each of the plurality of second sub-pixels SP2, and the plurality of third trenches 1343 can be disposed along edges of each of the plurality of third sub-pixels SP3.

In addition, at least some of the plurality of trenches 1340 can be connected to each other to be integrally formed in consideration of a spacing between the plurality of sub-pixels SP. Therefore, in the display apparatus 1300 according to another exemplary embodiment of the present disclosure, the design of the plurality of trenches 1340 can be easily changed corresponding to the design of the plurality of sub-pixels SP, and the leakage current flowing to the adjacent sub-pixels SP can be reduced to improve the display quality.

Figure 15:
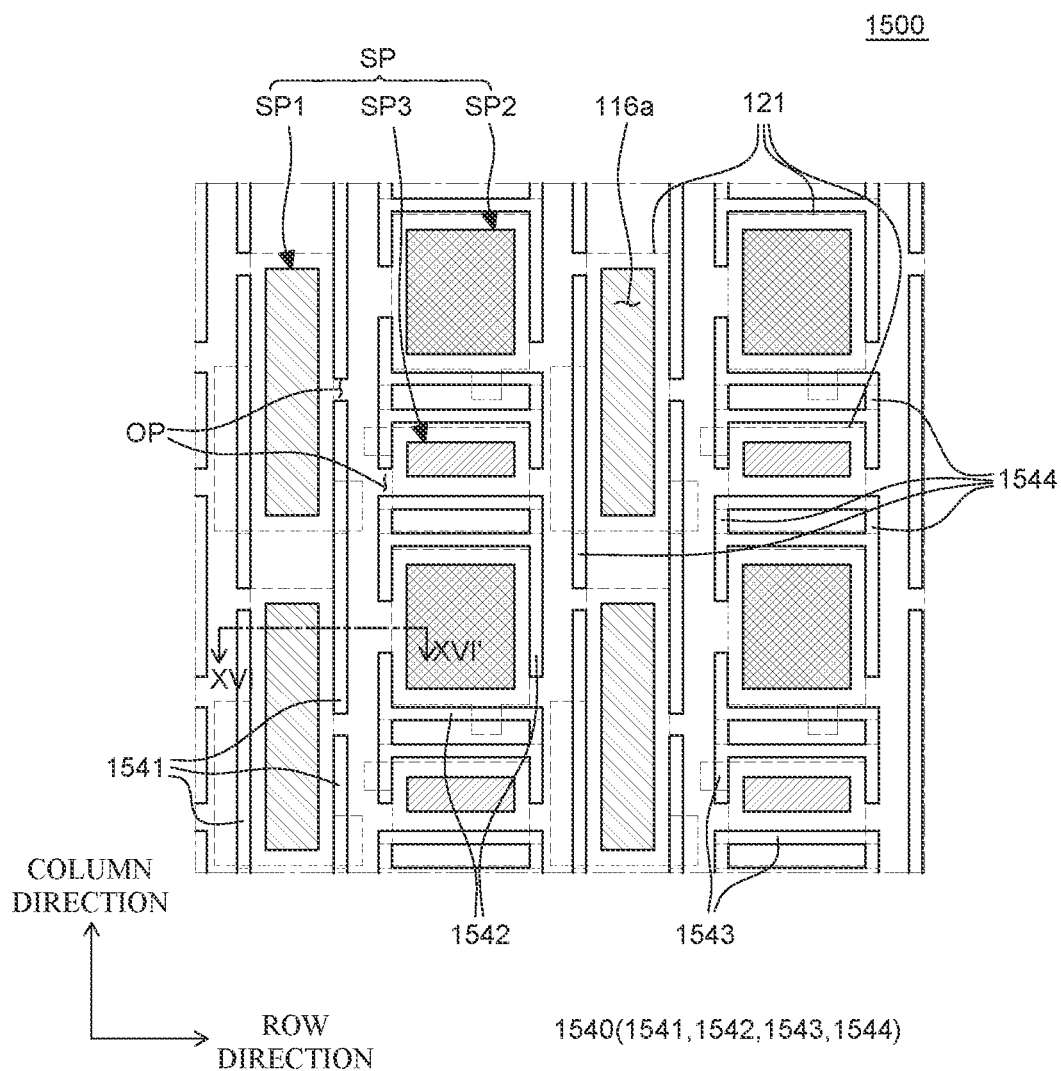
FIG. 15 is an enlarged plan view of a display apparatus according to another exemplary embodiment of the present disclosure.
Figure 16:
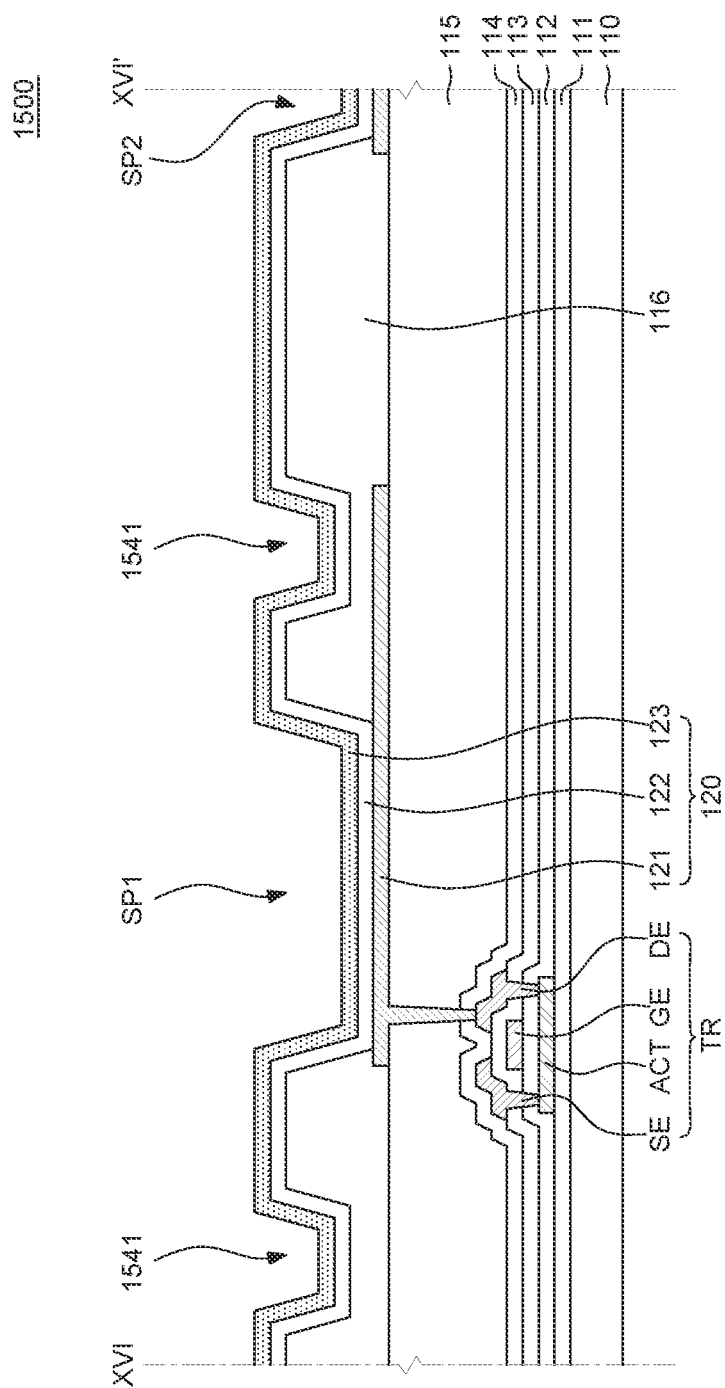
FIG. 16 is a cross-sectional view taken along line XVI-XVI' of FIG. 15.

FIG. 15 is an enlarged plan view of a display apparatus according to another exemplary embodiment of the present disclosure. FIG. 16 is a cross-sectional view taken along line XVI-XVI' of FIG. 15. A display apparatus 1500 of FIGS. 15 and 16 is different in a plurality of trenches 1540 compared with the display apparatus 1300 of FIGS. 13 and 14, and other components are substantially the same, and therefore, a redundant description thereof will be omitted or may be briefly provided.

Referring to FIGS. 15 and 16, a depth of each of a plurality of trenches 1540 can be smaller than a thickness of the bank 116. In the plurality of trenches 1540, the planarization layer 115 under the bank 116 may not be exposed. In this case, even if the plurality of trenches 1540 overlaps a part of the anode 121, the anode 121 may not be exposed from the bank 116, and light emission in areas other than the emission areas of the plurality of sub-pixels SP can be blocked. Accordingly, the plurality of trenches 1540 is not limited to the shape and disposition of the anode 121 and can be variously designed.

Referring to FIG. 15, the plurality of trenches 1540 surrounding each of the plurality of sub-pixels SP can overlap a part of the anode 121 of the plurality of sub-pixels SP. For example, a first trench 1541 corresponding to a left portion of the first sub-pixel SP1 can partially overlap the anode 121 of the first sub-pixel SP1. The second trench 1542 corresponding to the lower portion of the second sub-pixel SP2 can partially overlap the anode 121 of the second sub-pixel SP2.

In addition, the plurality of trenches 1540 further includes a plurality of auxiliary trenches 1544 extending from any one of a plurality of first trenches 1541, a plurality of second trenches 1542, and a plurality of third trenches 1543.

For example, one of the plurality of auxiliary trenches 1544 can extend from an end portion of the first trench 1541 corresponding to a left portion and a right portion of each of the plurality of first sub-pixels SP1 toward the adjacent first sub-pixels SP1. In addition, the auxiliary trench 1544 extending from the first trench 1541 in the right portion can also be connected to the first trench 1541 corresponding to the right portion of the adjacent first sub-pixels SP1. For example, the first trenches 1541 corresponding to each of the different first sub-pixels SP1 can be connected to each other by the auxiliary trench 1544.

For example, the other of the plurality of auxiliary trenches 1544 can extend from the second trench 1542 corresponding to a lower portion of each of the plurality of second sub-pixels SP2 toward the adjacent third sub-pixels SP3. In addition, the auxiliary trench 1544 extending from the second trench 1542 toward the adjacent third sub-pixels SP3 can also be connected to the third trench 1543 corresponding to the upper portion of the third sub-pixel SP3. The second trench 1542 and the third trench 1543 can be connected to each other by the auxiliary trench 1544.

In the display apparatus 1500 according to another exemplary embodiment of the present disclosure, the depth of each of the plurality of trenches 1540 is formed to be smaller than the thickness of the bank 116, so the plurality of trenches 1540 can be variously designed without being limited in the shape and disposition of the anode 121. When the depth of each of the plurality of trenches 1540 is smaller than the thickness of the bank 116, even if the plurality of trenches 1540 overlaps the anode 121, the anode 121 may not be exposed in an area other than the opening 116a of the bank 116, and light can be emitted only from the emission areas of the plurality of sub-pixels SP. Therefore, the plurality of trenches 1540 can be disposed along the shape of the anode 121, but can be disposed to partially overlap the anode 121. The plurality of trenches 1540 can be disposed in an area overlapping the anode 121, and more trenches 1540 can be disposed in an area between the emission areas of the plurality of sub-pixels SP. Accordingly, the depth of each of the plurality of trenches 1540 can be formed to be smaller than the thickness of the bank 116 to improve the design of freedom in the plurality of trenches 1540.

The embodiments of the present disclosure can improve the current leakage through the common layers of the plurality of light emitting devices.

The embodiments of the present disclosure can improve the color reproducibility by suppressing the unintended light emitting device from emitting light while driving the display apparatus.

The embodiments of the present disclosure can improve the display quality by minimizing the visual recognition of spots or color abnormalities when displaying the low-gradation image.

The exemplary embodiments of the present disclosure can also be described as follows:

According to an aspect of the present disclosure, there is provided a display apparatus. The display apparatus includes a substrate on which a plurality of sub-pixels is defined a plurality of anodes which is disposed in each of the plurality of sub-pixels on the substrate. The display apparatus further includes an organic layer which is disposed on the plurality of anodes. The display apparatus further includes a cathode which is disposed on the organic layer. The display apparatus further includes a bank which is disposed between the anode and the organic layer, between emission areas of each of the plurality of sub-pixels and including a plurality of trenches. The organic layer and the cathode are disposed in the bank and the plurality of trenches.

The organic layer can include a light emitting layer and a common layer disposed on the plurality of sub-pixels, and a resistance of the common layer increases as the common layer approaches the plurality of trenches.

A depth of each of the plurality of trenches can be the same as a thickness of the bank. The plurality of trenches may not overlap the anode.

A depth of each of the plurality of trenches can be smaller than a thickness of the bank. At least one of the plurality of trenches partially can overlaps the anode.

The plurality of sub-pixels can include a first sub-pixel, a second sub-pixel, and a third sub-pixel. A turn-on voltage of the first sub-pixel among the plurality of sub-pixels can be the highest. A turn-on voltage of the third sub-pixel among the plurality of sub-pixels can be the lowest.

The number of the plurality of trenches disposed between the first sub-pixel and the third sub-pixel which are adjacent to each other can be different from the number of the plurality of trenches disposed between the second sub-pixel and the third sub-pixel which are adjacent to each other.

The plurality of trenches can include a plurality of first trenches which is disposed to correspond to edges of each of the plurality of first sub-pixels, a plurality of second trenches which is disposed to correspond to edges of each of the plurality of second sub-pixels, and a plurality of third trenches which is disposed to correspond to edges of each of the plurality of third sub-pixels.

The plurality of trenches further can include a plurality of auxiliary trenches extending from one of the plurality of first trenches, the plurality of second trenches, and the plurality of third trenches toward each of the plurality of sub-pixels.

The plurality of trenches can further include a plurality of auxiliary trenches which is spaced apart from the plurality of first trenches, the plurality of second trenches, and the plurality of third trenches and disposed between the emission areas of each of the plurality of sub-pixels.

The plurality of trenches can further include a plurality of open areas in which each of the plurality of trenches is opened to be spaced apart from each other. Some of the plurality of open areas can be disposed to be interlacingly disposed to some other of the plurality of open areas adjacent to the some open areas. Some other of the plurality of open areas can face some of the plurality of trenches.

The display apparatus can further include a spacer which is disposed on the bank between the emission areas of the plurality of sub-pixels. The spacer is spaced apart from the plurality of trenches.

According to another aspect of the present disclosure, there is provided a display apparatus. The display apparatus includes a substrate on which a plurality of sub-pixels including red sub-pixels, green sub-pixels, and blue sub-pixels is disposed, a plurality of light emitting devices which is disposed on each of the plurality of sub-pixels and shares a common layer and a cathode, a bank which is disposed under the cathode between each of the plurality of light emitting devices, and a plurality of trenches which is disposed in the bank and spaced apart from each other. A resistance of the common layer and the cathode increases as the common layer and the cathode approaches the plurality of trenches.

The plurality of trenches can include a plurality of first trenches which is disposed along edges of each of the blue sub-pixels and spaced apart from each other, a plurality of second trenches which is disposed along edges of each of the green sub-pixels and spaced apart from each other, a plurality of third trenches which is disposed along edges of each of the red sub-pixels and spaced apart from each other, and a plurality of open areas which is an area between the plurality of first trenches spaced apart from each other, an area between the plurality of second trenches spaced apart from each other, and an area between the plurality of third trenches spaced apart from each other.

Some of the plurality of open areas corresponding to the blue sub-pixels can be interlacingly disposed to some other of the plurality of open areas corresponding to the red sub-pixels among the plurality of open areas.

The plurality of trenches further can include a plurality of auxiliary trenches which is disposed between emission areas of each of the plurality of sub-pixels. At least some of the plurality of auxiliary trenches can extend from the plurality of second trenches and disposed to correspond to the open area between the plurality of first trenches.

The blue sub-pixels can be alternately disposed in the same row as the red sub-pixels. The green sub-pixels can be disposed in different rows and different columns from the blue sub-pixels. The number of trenches disposed between the blue sub-pixel and the red sub-pixel which are adjacent to each other among the plurality of trenches can be different from the number of trenches disposed between the green sub-pixels which are adjacent to each other among the plurality of trenches.

The blue sub-pixel can be disposed in a plurality of columns, the green sub-pixels. The red sub-pixel can be disposed in a column between each of the plurality of columns in which the blue sub-pixel is disposed. The green sub-pixel and the red sub-pixel can be alternately disposed in the same column. The number of trenches disposed between the blue sub-pixel and the red sub-pixel which are adjacent to each other among the plurality of trenches can be different from the number of trenches disposed between the blue sub-pixels which are adjacent to each other among the plurality of trenches.

The display apparatus can further include a spacer which is disposed between the bank and the common layer and spaced apart from the plurality of trenches.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus, comprising:
   a substrate on which a plurality of sub-pixels disposed in an area where an image is displayed are defined;
   a plurality of anodes disposed in the plurality of sub-pixels on the substrate;
   an organic layer disposed on the plurality of anodes;
   a cathode disposed on the organic layer; and
   a bank disposed between the plurality of anodes and the organic layer, and between emission areas of each of the plurality of sub-pixels, the bank including a plurality of trenches,
   wherein the organic layer and the cathode are disposed in the bank and the plurality of trenches,
   wherein the plurality of sub-pixels include a first sub-pixel, a second sub-pixel, and a third sub-pixel,
   wherein a number of trenches disposed between the first sub-pixel and the third sub-pixel is greater than a number of trenches disposed between the first sub-pixel and the second sub-pixel and a number of trenches disposed between the second sub-pixel and the third sub-pixel,
   wherein the first sub-pixel and the third sub-pixel are adjacent to each other in a first direction, and the first sub-pixel and the second sub-pixel are adjacent to each other in a second direction different from the first direction, and
   wherein at least two trenches are disposed between the first sub-pixel and the second sub-pixel, and at least three trenches are disposed between the first sub-pixel and the third sub-pixel.

2. The display apparatus of claim 1,
   wherein the organic layer of each of the plurality of sub-pixels is connected to each other and integrally formed.

3. The display apparatus of claim 1,
   wherein a depth of each of the plurality of trenches is same as a thickness of the bank, and
   the plurality of trenches does not overlap the plurality of anodes.

4. The display apparatus of claim 1,
   wherein a depth of each of the plurality of trenches is smaller than a thickness of the bank, and
   at least one of the plurality of trenches partially overlaps at least one anode among the plurality of anodes.

5. The display apparatus of claim 1,
   wherein a turn-on voltage of the first sub-pixel among the plurality of sub-pixels is the highest, and
   a turn-on voltage of the third sub-pixel among the plurality of sub-pixels is the lowest.

6. The display apparatus of claim 1,
   wherein the plurality of trenches include:
   a plurality of first trenches disposed to correspond to edges of the plurality of first sub-pixels;
   a plurality of second trenches disposed to correspond to edges of the plurality of second sub-pixels; and
   a plurality of third trenches disposed to correspond to edges of the plurality of third sub-pixels.

7. The display apparatus of claim 6,
   wherein the plurality of trenches further include a plurality of auxiliary trenches extending from one of the plurality of first trenches, the plurality of second trenches, and the plurality of third trenches toward one of the plurality of sub-pixels.

8. The display apparatus of claim 6,
   wherein the plurality of trenches further include a plurality of auxiliary trenches spaced apart from the plurality of first trenches, the plurality of second trenches, and the plurality of third trenches and disposed between the emission areas of the plurality of sub-pixels.

9. The display apparatus of claim 1,
   wherein the plurality of trenches further include a plurality of open areas in which each of the plurality of trenches is opened to be spaced apart from each other, and
   some open areas among the plurality of open areas are interlacingly disposed to some other open areas among the plurality of open areas adjacent to the some open areas.

10. The display apparatus of claim 9,
    wherein some open areas among the plurality of open areas face some trenches among the plurality of trenches.

11. The display apparatus of claim 1, further comprising:
    a spacer disposed on the bank between the emission areas of the plurality of sub-pixels, and
    wherein the spacer is spaced apart from the plurality of trenches.

12. The display apparatus of claim 5, wherein the number of the trenches disposed between the second sub-pixel and the third sub-pixel which are adjacent to each other, is smaller than the number of the trenches disposed between the first sub-pixel and the third sub-pixel which are adjacent to each other.

13. The display apparatus of claim 6, wherein at least some of the first trenches, the second trenches, and the third trenches are connected to each other.

14. The display apparatus of claim 9, wherein sizes of the plurality of open areas are different from each other.

15. The display apparatus of claim 14, wherein the plurality of open areas are disposed in an upper portion, a lower portion, a left portion and a right portion of one second sub-pixel, respectively,
    a size of an open area corresponding to the upper portion of the one second sub-pixel is larger than a size of open areas corresponding to the left and right portions of the one second sub-pixel.

16. The display apparatus of claim 1, wherein at least one of the plurality of trenches extends in a first direction and a second direction perpendicular to the first direction in the plan view.

17. The display apparatus of claim 1, wherein at least one of the plurality of trenches has a "Y" shaped portion in the plan view, a "U" shape in the plan view, or a "C" shape in the plan view.

18. The display apparatus of claim 1, wherein at least one of the plurality of trenches includes at least two forked portions in the plan view.

19. The display apparatus of claim 1, wherein three or more sides of the first subpixel are surrounded by one of the plurality of trenches.

20. The display apparatus of claim 1, wherein at least one of the plurality of trenches includes a closed loop shape disposed between two adjacent sub-pixels among plurality of sub-pixels.

21. The display apparatus of claim 1, wherein at least one of the plurality of trenches includes two "Y" shaped portions that are symmetrical with each other in the plan view.

22. The display apparatus of claim 1, wherein at least one of the plurality of trenches includes a bend corresponding to a corner of one of the first, second and third sub-pixels in a plan view, or at least two sides of each of the first, second and third sub-pixels is surrounded by one or more of the plurality of trenches in the plan view.

* * * * *